US012660679B2

(12) United States Patent
Nakano

(10) Patent No.: US 12,660,679 B2
(45) Date of Patent: Jun. 16, 2026

(54) SEMICONDUCTOR MODULE

(71) Applicant: FUJI ELECTRIC CO., LTD.,
Kawasaki (JP)

(72) Inventor: Hayato Nakano, Kofu-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 934 days.

(21) Appl. No.: 17/895,596

(22) Filed: Aug. 25, 2022

(65) Prior Publication Data

US 2023/0124426 A1     Apr. 20, 2023

(30) Foreign Application Priority Data

Oct. 18, 2021     (JP) ................................. 2021-170124

(51) Int. Cl.
 *H10W 74/47* (2026.01)
 *H10W 74/10* (2026.01)
 *H10W 76/60* (2026.01)
(52) U.S. Cl.
 CPC ......... *H10W 74/47* (2026.01); *H10W 74/127*
 (2026.01); *H10W 76/60* (2026.01)
(58) Field of Classification Search
 CPC ... H01L 23/293; H01L 23/10; H01L 23/3142;
 H10W 74/47; H10W 74/127; H10W
 76/60
 See application file for complete search history.

(56) References Cited

U.S. PATENT DOCUMENTS

| | | | |
|---|---|---|---|
| 6,521,983 | B1 | 2/2003 | Yoshimatsu et al. |
| 9,147,666 | B2 | 9/2015 | Yoshihara et al. |
| 9,490,200 | B2 | 11/2016 | Yoshihara et al. |
| 9,691,674 | B2 | 6/2017 | Kodaira |
| 9,966,344 | B2 | 5/2018 | Soyano |
| 10,396,056 | B2 | 8/2019 | Soyano |
| 10,770,376 | B2 | 9/2020 | Nakata et al. |
| 10,784,214 | B2 | 9/2020 | Soyano et al. |
| 10,978,366 | B2 | 4/2021 | Fujino et al. |
| 11,075,190 | B2 | 7/2021 | Soyano |

(Continued)

FOREIGN PATENT DOCUMENTS

| | | |
|---|---|---|
| JP | 02150051 A | 6/1990 |
| JP | 2002-76255 A | 3/2002 |

(Continued)

OTHER PUBLICATIONS

Nakada (WO 2018/087890 A1; English Translation) (Year: 2018).*

(Continued)

*Primary Examiner* — Pete T Lee

(57) ABSTRACT

There is provided a semiconductor module capable of pre-
venting the adhesion of an epoxy resin to terminals to which
at least one of a large current and a high voltage is supplied.
A semiconductor module includes: a sealing section formed
of an epoxy resin and sealing transistors; an intermediate
terminal having a fastening surface to which a cable con-
nected to a load as a drive target is fastened in a direction
intersecting the thickness direction of a sealing section and
connected to the transistors; and a structure arranged
between the sealing section and the fastening surface and
having an input section higher than a surface of the sealing
section and the fastening surface.

8 Claims, 10 Drawing Sheets

(56) References Cited

U.S. PATENT DOCUMENTS

| | | | |
|---|---|---|---|
| 2004/0218372 A1* | 11/2004 | Hamasaki | H05K 1/0263 |
| | | | 361/767 |
| 2012/0256194 A1 | 10/2012 | Yoshihara et al. | |
| 2015/0371937 A1 | 12/2015 | Yoshihara et al. | |
| 2016/0225685 A1 | 8/2016 | Kodaira | |
| 2017/0006721 A1 | 1/2017 | Soyano | |
| 2017/0077044 A1 | 3/2017 | Soyano | |
| 2019/0157221 A1 | 5/2019 | Soyano et al. | |
| 2019/0295932 A1 | 9/2019 | Nakata et al. | |
| 2019/0348402 A1 | 11/2019 | Soyano | |
| 2020/0083129 A1 | 3/2020 | Fujino et al. | |

FOREIGN PATENT DOCUMENTS

| | | |
|---|---|---|
| JP | 2010-98036 A | 4/2010 |
| JP | 2016-225377 A | 12/2016 |
| JP | 2017-17195 A | 1/2017 |
| JP | 2018-50084 A | 3/2018 |
| JP | 2018-207131 A | 12/2018 |
| WO | 2015/141325 A1 | 9/2015 |
| WO | 2016084622 A1 | 6/2016 |
| WO | 2018/087890 | 5/2018 |
| WO | 2018142863 A1 | 8/2018 |
| WO | 2018/207656 A1 | 11/2018 |

OTHER PUBLICATIONS

Inou ( JP 2020098885 A; published in Jun. 25, 2020) (Year: 2020).*

Japanese Office Action issued in counterpart Japanese Application No. 2021-170124 dated Jun. 24, 2025.

Japanese Office Action dated Sep. 24, 2025 for the corresponding Japanese Patent Application No. 2021-170124.

* cited by examiner

SEMICONDUCTOR MODULE

CROSS-REFERENCE TO RELATED APPLICATIONS

This application is based upon and claims the benefit of priority from the prior Japanese Patent Application No. 2021-170124 filed on Oct. 18, 2021, the entire contents of which are incorporated herein by reference.

TECHNICAL FIELD

The present invention relates to a semiconductor module applied to power converters and the like.

BACKGROUND ART

PTL 1 discloses a semiconductor module including: abase plate; a resin case provided on the base plate; three main terminals attached to the resin case; a plurality of semiconductor chips provided on the base plate in a hollow space of the resin case; and a sealing material injected into the hollow space. PTL 2 discloses a semiconductor module including: a plurality of semiconductor chips; a resin case housing the plurality of semiconductor chips; an input terminal and a three-phase output terminal connected to a main power supply provided on the surface of the resin case; and a resin sealing the plurality of semiconductor chips. PTL 3 discloses a semiconductor module including: a plurality of transistors; a package housing the plurality of transistors; and an input terminal for power supply fixed to the package and an output terminal connected to a motor.

CITATION LIST

Patent Literatures

PTL 1: WO 2016/084622
PTL 2: WO 2018/142863
PTL 3: JP H2(1990)-150051 A

SUMMARY OF INVENTION

Technical Problem

To the main terminals of the semiconductor module disclosed in PTL 1, the input terminal or the three-phase output terminal of the semiconductor module disclosed in PTL 2, and the input terminal or the output terminal of the semiconductor module disclosed in PTL 3, a large current flows or a high voltage is applied, as compared with control terminals connected to control terminals of semiconductor chips or transistors. In conventional semiconductor modules, an epoxy resin forming a sealing material sometimes adheres to such terminals to which a large current flows or a high voltage is applied. The epoxy resin is an insulating material. Therefore, the adhesion of the epoxy resin to the terminals to which a large current flows or a high voltage is applied increases the contact resistance between predetermined cables connected to the terminals and the terminals, so that the terminals generate heat or a desired current does not flow to the terminals or a desired voltage is not applied to the terminals in some cases. Thus, the semiconductor modules have posed problems, such as a reduction in the efficiency for driving a load, such as a motor, and the inability to drive the load.

It is an object of the present invention to provide a semiconductor module capable of preventing the adhesion of an epoxy resin to terminals to which at least one of a large current and a high voltage is supplied.

Solution to Problem

To achieve the above-described object, a semiconductor module according to one aspect of the present invention includes: a sealing section formed of an epoxy resin and sealing a plurality of switching elements; an intermediate terminal having a fastening surface to which a cable connected to a load as a drive target is fastened in a direction intersecting the thickness direction of the sealing section and connected to the plurality of switching elements; and a structure arranged between the sealing section and the fastening surface and having at least a part higher than the surface of the sealing section and the fastening surface.

Advantageous Effects of Invention

One aspect of the present invention can prevent the adhesion of an epoxy resin to terminals to which at least one of a large current and a high voltage is supplied.

BRIEF DESCRIPTION OF DRAWINGS

FIG. 1 is a schematic plan view illustrating a schematic configuration example of a semiconductor module according to a first embodiment of the present invention;

FIG. 3 is a schematic configuration example of the U-phase inverter section provided in the semiconductor module according to the first embodiment of the present invention and is a schematic cross-sectional view cut along the $\alpha$-$\alpha$ line illustrated in FIG. 2;

FIG. 10 is a schematic cross-sectional view illustrating a schematic configuration example of a U-phase inverter section provided in a semiconductor module according to a third embodiment of the present invention.

DESCRIPTION OF EMBODIMENTS

Each embodiment of the present invention exemplifies devices or methods for embodying the technical idea of the present invention. The technical idea of the present invention does not specify materials, shapes, structures, arrangement, and the like of constituent parts to the materials, shapes, structures, arrangement, and the like described below. The technical idea of the present invention can be variously altered within the technical scope specified by claims.

First Embodiment

A semiconductor module according to a first embodiment of the present invention is described using FIGS. 1 to 7. First, the schematic configuration of the semiconductor module according to this embodiment is described using FIGS. 1 to 4. In this embodiment, a power conversion module capable of performing DC/AC conversion as a semiconductor module is described as an example.
(Entire Configuration of Semiconductor Module)

Figure 1:
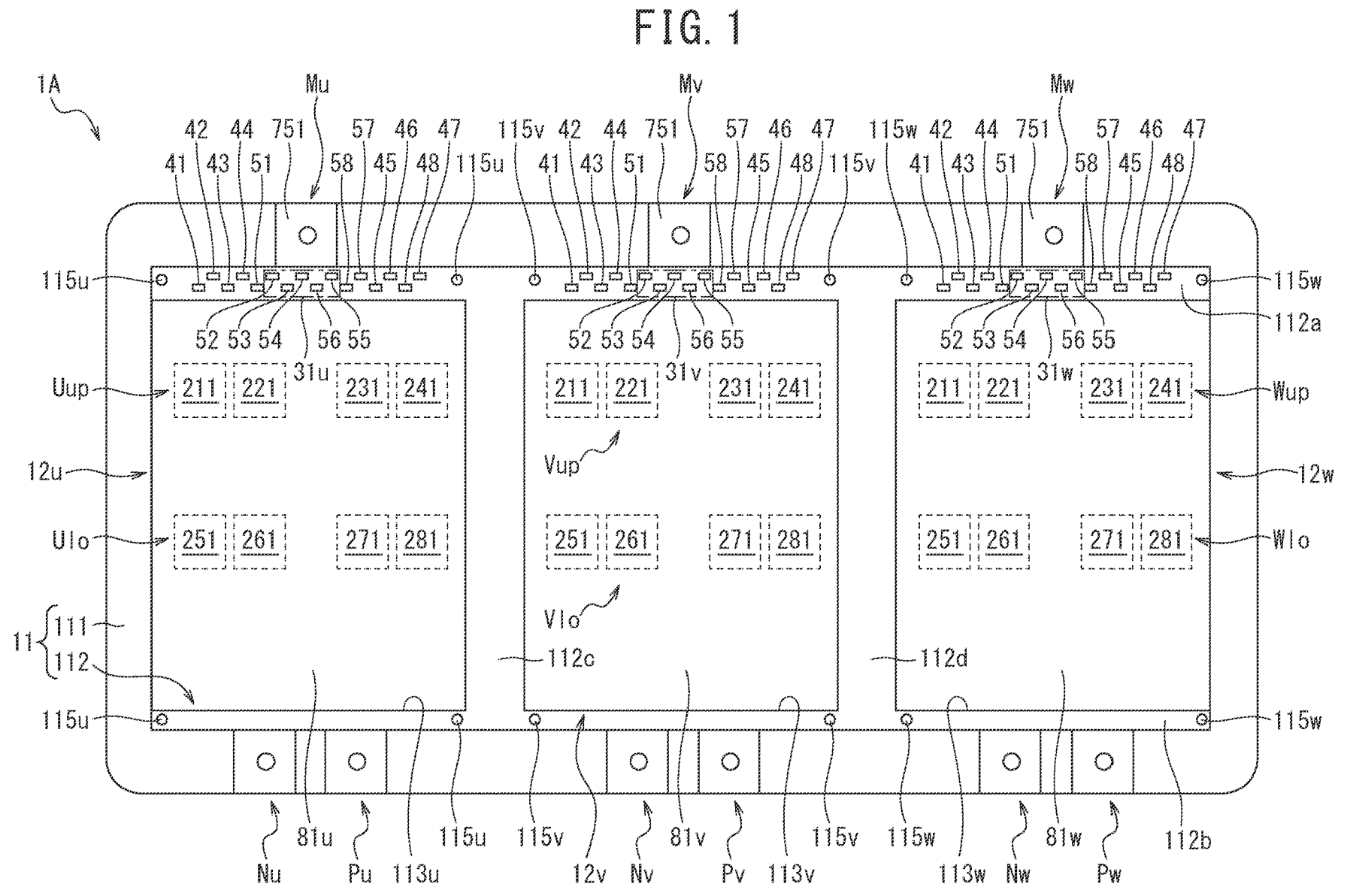
Figure 2:
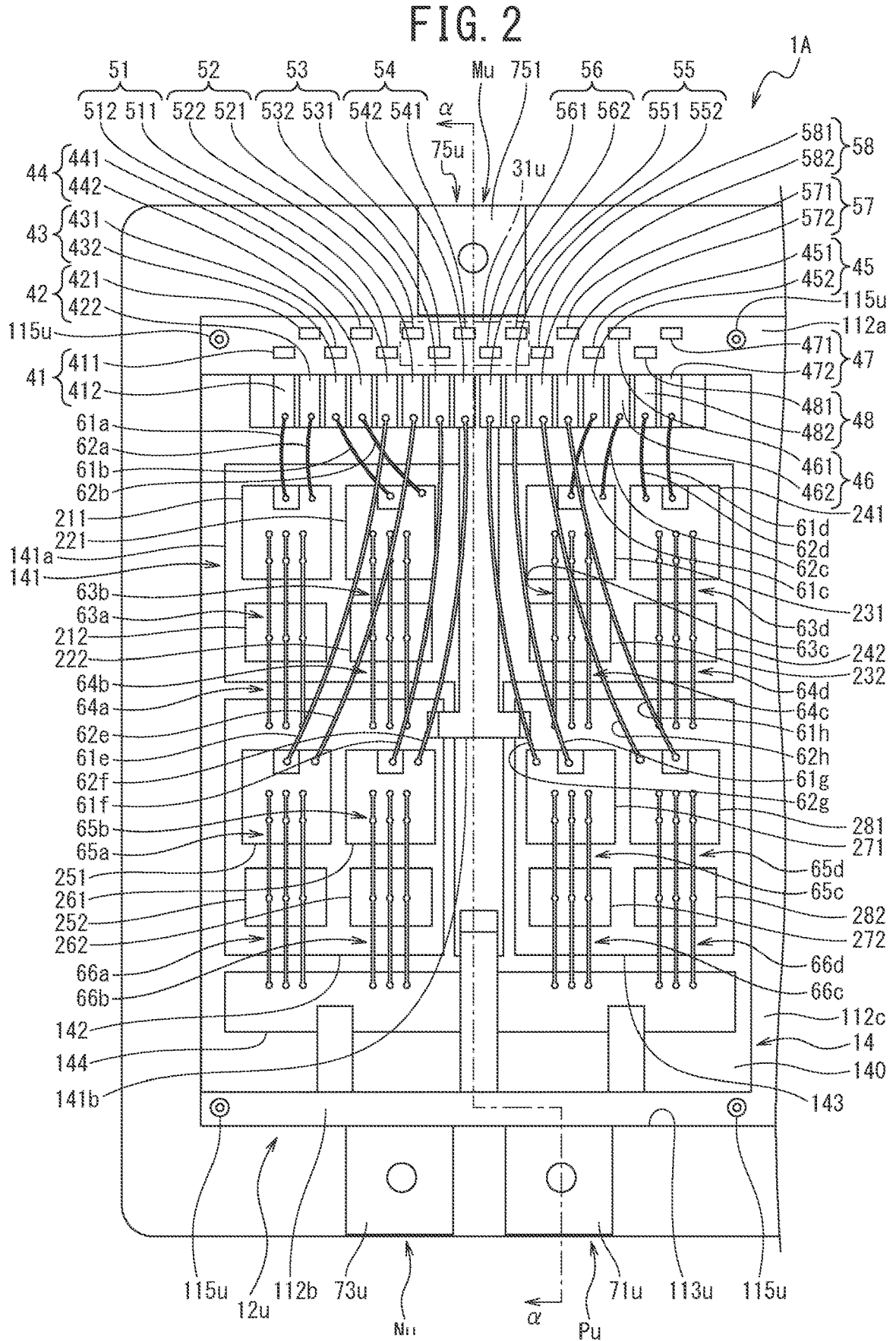
FIG. 2 is a diagram schematically illustrating a schematic configuration example of a U-phase inverter section provided in the semiconductor module according to the first embodiment of the present invention.
Figure 3:
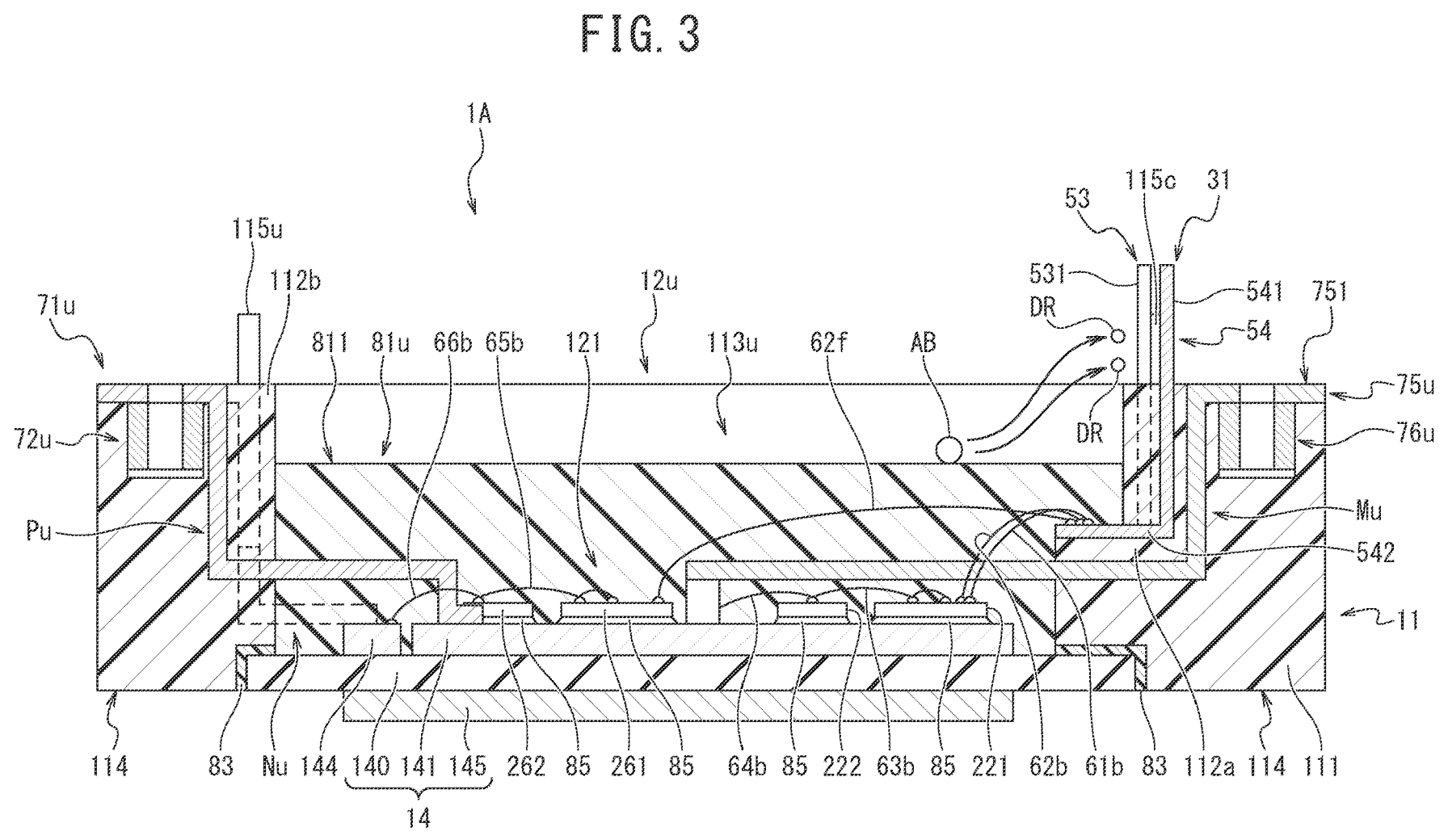
Figure 4:
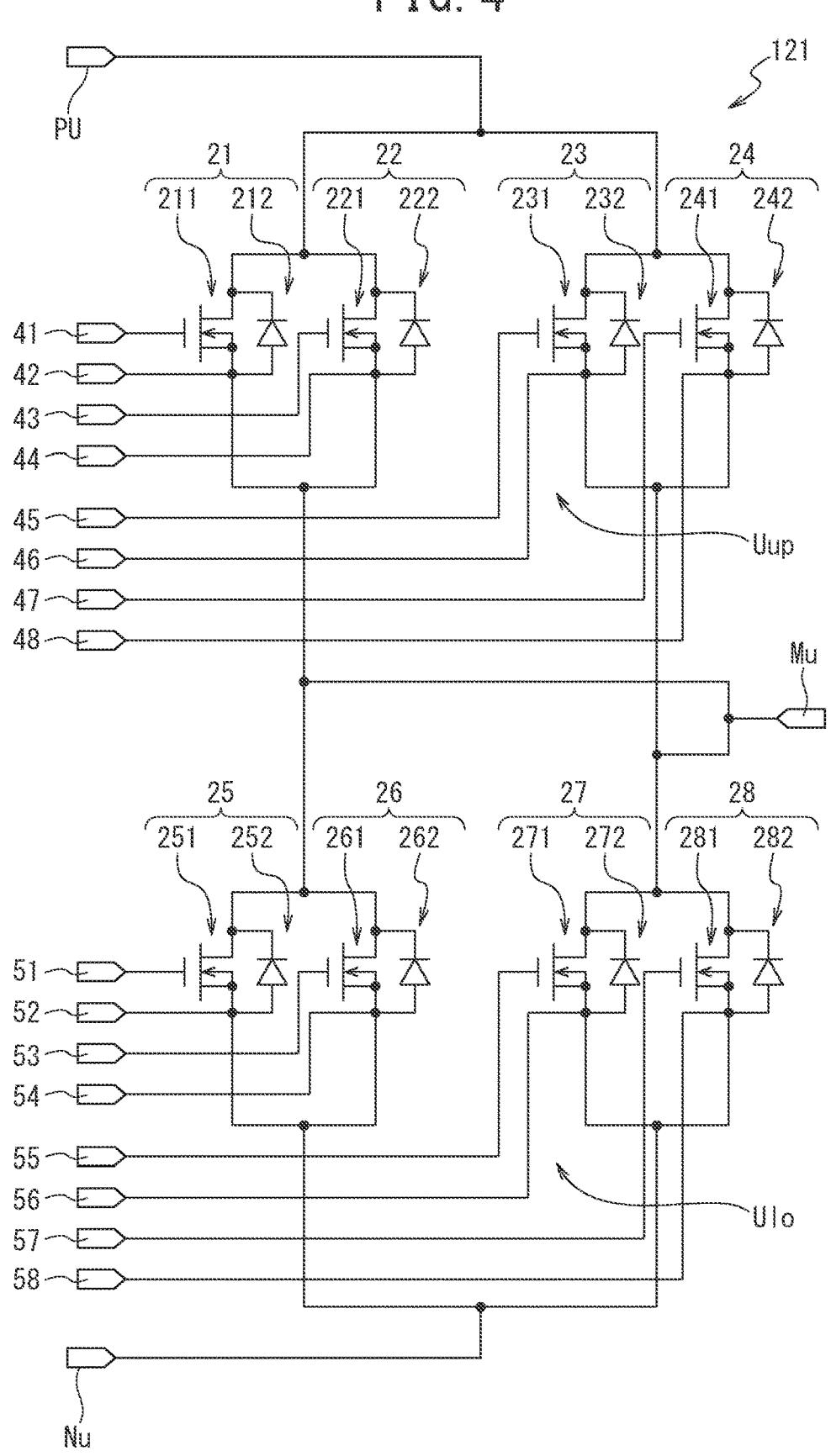
FIG. 4 is a circuit diagram of the U-phase inverter section provided in the semiconductor module according to the first embodiment of the present invention.

FIG. 1 is a schematic plan view illustrating a schematic configuration example of a semiconductor module 1A according to this embodiment. In FIG. 1, for ease of understanding, transistors 211, 221, 231, 241, 251, 261, 271, 281 sealed by each of sealing sections 81u, 81v, 81w and invisible are illustrated by broken lines. FIG. 2 is a diagram schematically illustrating a schematic configuration example of a U-phase inverter section 12u provided in the semiconductor module 1A. FIG. 2 does not illustrate the sealing sections 81u, 81v, 81w for ease of understanding. FIG. 3 is a schematic cross-sectional view of the U-phase inverter section 12u cut along the α-α line illustrated in FIG. 2. FIG. 3 schematically illustrates a bubble generated when the sealing sections 81u, 81v, 81w are formed and droplets caused by the bubble for ease of understanding. FIG. 4 is a circuit diagram of an inverter circuit 121 provided in the U-phase inverter section 12u.

As illustrated in FIG. 1, the semiconductor module 1A according to this embodiment includes the sealing section 81u made of an epoxy resin and sealing the plurality (eight transistors in this embodiment) of transistors (an example of the switching elements) 211, 221, 231, 241, 251, 261, 271, 281. The semiconductor module 1A includes the sealing section 81v made of an epoxy resin and sealing the plurality (eight transistors in this embodiment) of transistors (an example of the switching elements) 211, 221, 231, 241, 251, 261, 271, 281. The semiconductor module 1A includes the sealing section 81w made of an epoxy resin and sealing the plurality (eight transistors in this embodiment) of transistors (an example of the switching elements) 211, 221, 231, 241, 251, 261, 271, 281. Hereinafter, the transistors 211, 221, 231, 241, 251, 261, 271, 281 are sometimes abbreviated as "transistors 211 to 281".

The semiconductor module 1A includes an intermediate terminal Mu having a fastening surface 751 to which a cable (not illustrated) connected to a load (not illustrated) as a drive target is fastened in a direction intersecting the thickness direction of the sealing section 81u and connected to the plurality of transistors 211 to 281. The semiconductor module 1A includes an intermediate terminal My having a fastening surface 751 to which a cable connected to a load as a drive target is fastened in a direction intersecting the thickness direction of the sealing section 81v and connected to the plurality of transistors 211 to 281. The semiconductor module 1A includes an intermediate terminal Mw having a fastening surface 751 to which a cable connected to a load as a drive target is fastened in a direction intersecting the thickness direction of the sealing section 81w and connected to the plurality of transistors 211 to 281.

As illustrated in FIG. 1, the semiconductor module 1A includes a case 11 defining a casting region 113u where the sealing section 81u is cast, a casting region 113v where the sealing section 81v is cast, and a casting region 113w where the sealing section 81w is cast. The case 11 is made of a thermoplastic resin, for example.

The case 11 has a rectangular shape in a plan view (in the thickness direction of the sealing sections 81u, 81v, 81w). The case 11 has a peripheral portion 111 having an annular shape and arranged in the periphery, and a partition section 112 partitioning a region surrounded by the peripheral portion 111 into the casting regions 113u, 113v, 113w. The partition section 112 has regions 112a, 112b extending along the longitudinal direction of the peripheral portion 111, a region 112c separating the casting region 113u and the casting region 113v, and a region 112d separating the casting region 113v and the casting region 113w.

The semiconductor module 1A has a positive electrode terminal Pu of the U-phase connected to the positive electrode side of DC power. The semiconductor module 1A has a negative electrode terminal Nu of the U-phase arranged next to the positive electrode terminal Pu and connected to the negative electrode side of the DC power. The semiconductor module 1A includes the intermediate terminal Mu serving as an output terminal from which U-phase AC power is output. The positive electrode terminal Pu and the negative electrode terminal Nu, and the intermediate terminal Mu are arranged on the peripheral portion 111 with the casting region 113u interposed therebetween. The positive electrode terminal Pu and the negative electrode terminal Nu are arranged on the region 112b side of the partition section 112, and the intermediate terminal Mu is arranged on the region 112a side of the partition section 112.

In a portion defining the casting region 113u of the region 112a of the partition section 112, gate signal output terminals 41, 43, 45, 47, 51, 53, 55, 57 and current detection terminals 42, 44, 46, 48, 52, 54, 56, 58 connected to the transistors 211, 221, 231, 241, 251, 261, 271, 281, respectively, provided in the U-phase inverter section 12u are arranged. Hereinafter, the gate signal output terminals 41, 43, 45, 47, 51, 53, 55, 57 are abbreviated as "gate signal output terminals 41 to 57", and the current detection terminals 42, 44, 46, 48, 52, 54, 56, 58 are abbreviated as "current detection terminals 42 to 58" in some cases.

The semiconductor module 1A has a positive electrode terminal Pv of the V-phase connected to the positive electrode side of DC power. The semiconductor module 1A has a negative electrode terminal Nv of the V-phase arranged next to the positive electrode terminal Pv and connected to the negative electrode side of the DC power. The semiconductor module 1A includes the intermediate terminal Mv serving an output terminal from which V-phase AC power is output. The positive electrode terminal Pv and the negative electrode terminal Nv, and the intermediate terminal Mv are arranged on the peripheral portion 111 with the casting region 113v interposed therebetween. The positive electrode terminal Pv and the negative electrode terminal Nv are arranged on the region 112b side of the partition section 112, and the intermediate terminal My is arranged on the region 112a side of the partition section 112.

In a portion defining the casting region 113v of the region 112a of the partition section 112, the gate signal output terminals 41 to 57 and the current detection terminals 42 to 58 connected to the transistors 211 to 281, respectively, provided in the V-phase inverter section 12v are arranged.

The semiconductor module 1A has a positive electrode terminal Pw of the W-phase connected to the positive electrode side of DC power. The semiconductor module 1A has a negative electrode terminal Nw of the W-phase arranged next to the positive electrode terminal Pw and connected to the negative electrode side of the DC power. The semiconductor module 1A includes the intermediate terminal Mw serving as an output terminal from which W-phase AC power is output. The positive electrode terminal Pw and the negative electrode terminal Nw, and the intermediate terminal Mw are arranged on the peripheral portion 111 with the casting region 113w interposed therebetween. The positive electrode terminal Pw and the negative electrode terminal Nw are arranged on the region 112b side of the partition section 112, and the intermediate terminal Mw is arranged on the region 112a side of the partition section 112.

In a portion defining the casting region 113w of the region 112a of the partition section 112, the gate signal output terminals 41 to 57 and the current detection terminals 42 to 58 connected to the transistors 211 to 281, respectively, provided in the W-phase inverter section 12w are arranged.

As illustrated in FIG. 1, the semiconductor module 1A includes a structure 31u arranged between the sealing section 81u and the fastening surface 751 of the intermediate terminal Mu and having at least a part higher than the surface of the sealing section 81u and the fastening surface 751. In this embodiment, the structure 31u has the gate signal output terminals 53, 55 (an example of the plurality of control terminals) from which a gate signal (an example of the control signal) for controlling each of the transistors 261 and 271 arranged in the casting region 113u is output. The structure 31u also has the current detection terminals 52, 54, 56 besides the gate signal output terminals 53, 55. Although details are described later, an unexpected bubble generated in casting the sealing section 81u in the casting region 113u is broken, so that droplets of a formation material forming the sealing section 81u, i.e., a sealing resin (epoxy resin in this embodiment), are sometimes scattered. The structure 31u having at least the gate signal output terminals 53, 55 is configured to prevent the droplets from adhering to the fastening surface 751 of the intermediate terminal Mu.

The semiconductor module 1A includes a structure 31v arranged between the sealing section 81v and the fastening surface 751 of the intermediate terminal My and having at least a part higher than the surface of the sealing section 81v and the fastening surface 751. In this embodiment, the structure 31v has the gate signal output terminals 53, 55 (an example of the plurality of control terminals) from which a gate signal (an example of the control signal) for controlling each of the transistors 261 and 271 arranged in the casting region 113v is output. The structure 31v also has the current detection terminals 52, 54, 56 besides the gate signal output terminals 53, 55. Although details are described later, the structure 31v having at least the gate signal output terminals 53, 55 is configured so that, when droplets of a sealing resin forming the sealing section 81v are generated in casting the sealing section 81v in the casting region 113v, the droplets are prevented from adhering to the fastening surface 751 of the intermediate terminal Mv, as with the structure 31u.

The semiconductor module 1A includes a structure 31w arranged between the sealing section 81w and the fastening surface 751 of the intermediate terminal Mw and having at least a part higher than the surface of the sealing section 81w and the fastening surface 751. In this embodiment, the structure 31w has the gate signal output terminals 53, 55 (an example of the plurality of control terminals) from which a gate signal (an example of the control signal) for controlling each of the transistors 261 and 271 arranged in the casting region 113w is output. The structure 31w also has the current detection terminals 52, 54, 56 besides the gate signal output terminals 53, 55. Although details are described later, the structure 31w having at least the gate signal output terminals 53, 55 is configured so that, when droplets of a sealing resin forming the sealing section 81w are generated in casting the sealing section 81w in the casting region 113w, the droplets are prevented from adhering to the fastening surface 751 of the intermediate terminal Mw, as with the structure 31u.

The case 11 has a fixation section 115u formed at each of the four corners of the casting region 113u, a fixation section 115v formed at each of the four corners of the casting region 113v, and a fixation section 115w formed at each of the four corners of the casting region 113w. Two fixation sections of the fixation sections 115u, 115v, 115w are arranged in each of the regions 112a, 112b of the partition section 112. The fixation sections 115u, 115v, 115w are formed to be higher than the peripheral portion 111 of the case 11 with a surface 114 (not illustrated in FIG. 1, see FIG. 3) of the case 11 on the side to which a direct bonded copper (DBC) substrate 14 (not illustrated in FIG. 1, see FIG. 3) is attached as a reference. The peripheral portion 111, the partition section 112, and the fixation sections 115u, 115v, 115w are integrally formed.

The four fixation sections 115u are provided to fix a circuit board (not illustrated) mounted with a control device (not illustrated) for controlling the inverter circuit 121 (not illustrated in FIG. 1, see FIG. 2) provided in the U-phase inverter section 12u. The four fixation sections 115v are provided to fix a circuit board (not illustrated) mounted with a control device (not illustrated) for controlling an inverter circuit (not illustrated) provided in the V-phase inverter section 12v. The four fixation sections 115w are provided to fix a circuit board (not illustrated) mounted with a control device (not illustrated) for controlling an inverter circuit (not illustrated) provided in the W-phase inverter section 12w.

Although details are described later, the transistor 211, the transistor 221, the transistor 231, and the transistor 241 provided in the U-phase inverter section 12u are connected in parallel, and the transistor 251, the transistor 261, the transistor 271, and the transistor 281 are connected in parallel. The transistors 211, 221, 231, 241 connected in parallel and the transistors 251, 261, 271, 281 connected in parallel are connected in series between the positive electrode terminal Pu and the negative electrode terminal Nu in the U-phase inverter section 12u. In the U-phase inverter section 12u, connection portions where the transistors 211 to 281 are connected to each other are connected to the intermediate terminal Mu from which the U-phase AC power is output. More specifically, the transistors 211, 221, 231, 241 each provided in the U-phase inverter section 12u form a part of constituent components constituting an upper arm Uup of the U-phase AC power. The transistors 251, 261, 271, 281 each provided in the U-phase inverter section 12u form apart of constituent components constituting a lower arm Ulo of the U-phase AC power.

The transistors 211 to 281 provided in the V-phase inverter section 12v are connected between the positive electrode terminal Pv and the negative electrode terminal Nv in the same manner as the connection state of the transistors 211 to 281 provided in the U-phase inverter section 12u between the positive electrode terminal Pu and the negative electrode terminal Nu. Therefore, the transistors 211, 221, 231, 241 each provided in the V-phase inverter section 12v form a part of constituent components constituting an upper arm Vup of the V-phase AC power. The transistors 251, 261, 271, 281 each provided in the V-phase inverter section 12v form a part of constituent components constituting a lower arm Vlo of the V-phase AC power.

The transistors 211 to 281 provided in the W-phase inverter section 12w are connected between the positive electrode terminal Pw and the negative electrode terminal Nw in the same manner as the connection state of the transistors 211 to 281 provided in the U-phase inverter section 12u between the positive electrode terminal Pu and the negative electrode terminal Nu. Therefore, the transistors 211, 221, 231, 241 each provided in the W-phase inverter section 12w form a part of constituent components constituting an upper arm Wup of the W-phase AC power. The transistors 251, 261, 271, 281 each provided in the W-phase inverter section 12w form a part of constituent components constituting a lower arm Wlo of the W-phase AC power.

(Configuration of Inverter Section)

Next, the schematic configurations of the U-phase inverter section 12u, the V-phase inverter section 12v, and the W-phase inverter section 12w provided in the semiconductor module 1A are described using FIGS. 2 to 4 referring to FIG. 1. The U-phase inverter section 12u, the V-phase inverter section 12v, and the W-phase inverter section 12w have the same configuration. Therefore, the schematic configurations of the U-phase inverter section 12u, the V-phase inverter section 12v, and the W-phase inverter section 12w are described taking the U-phase inverter section 12u as an example.

As illustrated in FIGS. 2 and 3, the U-phase inverter section 12u has the DBC substrate 14 and the inverter circuit 121 formed on the DBC substrate 14. The DBC substrate 14 has an insulating substrate 140 having substantially the same area as that of an opening of the casting region 113u and formed in a rectangular flat plate shape. The DBC substrate 14 has a positive electrode side wiring pattern 141, intermediate wiring patterns 142, 143, and a negative electrode side wiring pattern 144 formed on the insulating substrate 140 on the side sealed by the sealing section 81u (not illustrated in FIG. 2, see FIG. 3). The positive electrode side wiring pattern 141, the intermediate wiring patterns 142, 143, and the negative electrode side wiring pattern 144 are formed of a conductive material (for example, copper). The DBC substrate 14 has a rectangular flat plate-shaped heat transfer pattern 145 formed on the insulating substrate 140 on the back surface side of the side sealed by the sealing section 81u (not illustrated in FIG. 2, see FIG. 3). As illustrated in FIG. 3, the DBC substrate 14 is attached to the case 11 by an adhesive 83.

Although not illustrated, the semiconductor module 1A has a cooling unit (not illustrated) provided on the surface 114 side of the case 11 and attached to the case 11 in a state where the cooling unit contacts the heat transfer pattern 145. The cooling unit is mechanically fixed to the case 11 by an adhesive, for example. The DBC substrate 14 is soldered, for example, to the cooling unit. This enables the semiconductor module 1A to release the heat generated from the transistors 211 to 281 provided on the DBC substrate 14 to the outside via the cooling unit.

As illustrated in FIG. 2, the positive electrode side wiring pattern 141 has a T-shape as a whole. Specifically, the positive electrode side wiring pattern 141 has: a first portion 141a extending in a direction in which the gate signal output terminals 41 to 57 and the current detection terminals 42 to 58 are arranged and expands from the vicinity of the gate signal output terminals 41 to 57 and the current detection terminals 42 to 58 to substantially the center of the insulating substrate 140; and a second portion 141b extending from the first portion 141a toward the positive electrode terminal Pu and the negative electrode terminal Nu side. The first portion 141a has a rectangular shape in a plan view. The second portion 141b has an elongated rectangular shape extending from substantially the center of one long side of the first portion 141a toward the positive electrode terminal Pu and the negative electrode terminal Nu side in a plan view.

As illustrated in FIG. 2, the intermediate wiring pattern 142 and the intermediate wiring pattern 143 are arranged with the second portion 141b of the positive electrode side wiring pattern 141 interposed therebetween, for example. The intermediate wiring pattern 142 and the intermediate wiring pattern 143 are arranged along the long sides of the second portion 141b of the positive electrode side wiring pattern 141, for example. The intermediate wiring pattern 142 and the intermediate wiring pattern 143 each have a rectangular shape, for example, in a plan view. The intermediate wiring pattern 142 is arranged on the peripheral portion 111 side constituting the case 11. The intermediate wiring pattern 143 is arranged on the region 112c side (casting region 113v (not illustrated in FIG. 2, see FIG. 1) side) of the partition section 112 constituting the case 11.

As illustrated in FIG. 2, the negative electrode side wiring pattern 144 is arranged between the intermediate wiring pattern 142, the second portion 141b of the positive electrode side wiring pattern 141, and the intermediate wiring pattern 143, and the region 112b of the partition section 112. The negative electrode side wiring pattern 144 is formed in a rectangular shape in which the side of the short side of the casting region 113u is the long side, for example, in a plan view. The negative electrode side wiring pattern 144 has a long side having substantially the same length as that of the long side of the first portion 141a of the positive electrode side wiring pattern 141. The negative electrode side wiring pattern 144 is arranged to face the first portion 141a with a gap corresponding to the length of the second portion 141b of the positive electrode side wiring pattern 141. The intermediate wiring patterns 142, 143 are arranged in the gap between the positive electrode side wiring pattern 141 and the negative electrode side wiring pattern 144.

As illustrated in FIGS. 2 and 3, the positive electrode terminal Pu is provided to extend from the peripheral portion 111 of the case 11 to the second portion 141b of the positive electrode side wiring pattern 141. As illustrated in FIG. 3, the positive electrode terminal Pu is arranged along the side wall on the casting region 113u side of the peripheral portion 111 and passes through the inside of the region 112b of the partition section 112 constituting the case 11 and passes above the negative electrode side wiring pattern 144 to be connected to an end portion (tip end portion) of the second section 141b of the positive electrode side wiring pattern 141. Thus, the positive electrode terminal Pu is mechanically and electrically connected to the positive electrode side wiring pattern 141.

The positive electrode terminal Pu has a fastening section 71u (see FIGS. 2 and 3) which is arranged to be exposed to the outside in the peripheral portion 111 and to which a cable (not illustrated) connected to the positive electrode side of a DC power supply (not illustrated) generating DC power is fastened. The surface exposed to the outside of the fastening section 71$u$ serves as the fastening surface to which the cable is fastened. The positive electrode terminal Pu has a fixation section 72$u$ which is provided to be embedded in the peripheral portion 111 under the fastening section 71$u$ and to which a screw (not illustrated) for screwing the cable to the fastening section 71$u$ is fixed. A through hole penetrating through the fastening section 71$u$ is formed in substantially the center of the fastening section 71$u$. The fixation section 72$u$ has a cylindrical hole portion formed at a position corresponding to the through hole. The inner wall surface of the fixation section 72$u$ constituting the hole portion is threaded for fixing the screw. Thus, the cable can be screwed to the positive electrode terminal Pu.

As illustrated in FIGS. 2 and 3, the negative electrode terminal Nu is provided to extend from the peripheral portion 111 of the case 11 to the negative electrode side wiring pattern 144. As illustrated in FIG. 3, the negative electrode terminal Nu passes through the inside of the region 112$b$ of the partition section 112 constituting the case 11 not to contact the positive electrode terminal Pu and is branched and connected to two places of the negative electrode side wiring pattern 144. Thus, the negative electrode terminal Nu is mechanically and electrically connected to the negative electrode side wiring pattern 144.

The negative electrode terminal Nu has a fastening section 73$u$ which is arranged to be exposed to the outside in the peripheral portion 111 and to which a cable (not illustrated) connected to the negative electrode side of a DC power supply generating DC power is fastened. The surface exposed to the outside of the fastening section 73$u$ serves as the fastening surface to which the cable is fastened. The negative electrode terminal Nu has a fixation section (not illustrated) which is provided to be embedded in the peripheral portion 111 under the fastening section 73$u$ and to which a screw (not illustrated) for screwing the cable to the fastening section 73$u$ is fixed. The fastening section 73$u$ has the same configuration as that of the fastening section 71$u$, and the fixation section provided in the negative electrode terminal Nu has the same configuration as that of the fixation section 72$u$. Thus, a cable can be screwed to the negative electrode terminal Nu.

As illustrated in FIGS. 2 and 3, the intermediate terminal Mu is provided to extend from the peripheral portion 111 of the case 11 to the intermediate wiring patterns 142, 143. As illustrated in FIG. 3, the intermediate terminal Mu is arranged along the side wall on the casting region 113$u$ side of the peripheral portion 111 and passes through the inside of the region 112$a$ of the partition section 112 constituting the case 11 and passes above the first portion 141$a$ and the second portion 142$b$ of the positive electrode side wiring pattern 141 to be connected to the intermediate wiring patterns 142, 143. An end portion (tip end portion) on the intermediate wiring patterns 142, 143 side of the intermediate terminal Mu has a branched shape of being divided toward each of the intermediate wiring patterns 142, 143 above an end portion of the second portion 142$b$ on the first portion 141$a$ side of the positive electrode side wiring pattern 141. One of the branched tip end portions of the intermediate terminal Mu is connected to the intermediate wiring pattern 142, and the other one of the branched tip end portions of the intermediate terminal Mu is connected to the intermediate wiring pattern 143. Thus, the intermediate terminal Mu is mechanically and electrically connected to the intermediate wiring patterns 142, 143.

The intermediate terminal Mu has a fastening section 75$u$ (see FIGS. 2 and 3) which is arranged to be exposed to the outside in the peripheral portion 111 and to which a cable (not illustrated) connected to a load (e.g., motor) as a drive target cable is fastened. The surface exposed to the outside of the fastening section 75$u$ serves as the fastening surface 751 to which the cable is fastened. The intermediate terminal Mu has a fixation section 76$u$ which is provided to be embedded in the peripheral portion 111 under the fastening section 75$u$ and to which a screw (not illustrated) for screwing the cable to the fastening section 75$u$ is fixed. The fastening section 75$u$ has the same configuration as that of the fastening section 71$u$, and the fixation section 76$u$ has the same configuration as that of the fixation section 72$u$. Thus, a cable can be screwed to the intermediate terminal Mu.

As illustrated in FIG. 2, the gate signal output terminals 41 to 57 and the current detection terminals 42 to 58 are arranged in the region 112$a$ of the partition section 112 constituting the case 11. The gate signal output terminals 41 to 57 and the current detection terminals 42 to 58 each are made of a conductive material (for example, copper) and have a bent thin plate shape. The gate signal output terminals 41 to 57 and the current detection terminals 42 to 58 are arranged in the region 112$a$ not to contact with the intermediate terminal Mu. The gate signal output terminals 41 to 57 and the current detection terminals 42 to 58 each have an L-shape, for example.

As illustrated in FIGS. 2 and 3, the current detection terminal 54 has an output section 541 arranged to be partially embedded in the region 112$a$ and an input section 542 arranged to be partially exposed to the casting region 113$u$. The output section 541 extends in a direction substantially parallel to the in-plane direction of the inner wall surface of the case 11 (more specifically, region 112$a$) defining a part of the casting region 113$u$. The output section 541 has a part projecting from the region 112$a$ and exposed to the outside. The part exposed to the outside of the output section 541 is connected to a circuit board mounted with a control device for controlling the inverter circuit 121 provided in the U-phase inverter section 12$u$ (hereinafter sometimes referred to as "U-phase control device").

The input section 542 of the current detection terminal 54 extends in a direction substantially orthogonal to the in-plane direction of the inner wall surface of the case 11 (more specifically, region 112$a$). The input section 542 is connected to the transistor 261 by a bonding wire 62$f$.

The gate signal output terminal 41 has the same configuration as that of the current detection terminal 54. More specifically, the gate signal output terminal 41 has an input section 411 having the same configuration as that of the output section 541 of the current detection terminal 54 and an output section 412 having the same configuration as that of the input section 542 of the current detection terminal 54. A part exposed to the outside of the input section 411 is connected to the circuit board mounted with the U-phase control device. The output section 412 is connected to the transistor 211 by a bonding wire 61$a$.

The current detection terminal 42 has the same configuration as that of the current detection terminal 54. More specifically, the current detection terminal 42 has an output section 421 having the same configuration as that of the output section 541 of the current detection terminal 54 and an input section 422 having the same configuration as that of the input section 542 of the current detection terminal 54. A part exposed to the outside of the output section 421 is connected to the circuit board mounted with the U-phase control device. The input section 422 is connected to the transistor 211 by a bonding wire 62*a*.

The gate signal output terminal 43 has the same configuration as that of the current detection terminal 54. More specifically, the gate signal output terminal 43 has an input section 431 having the same configuration as that of the output section 541 of the current detection terminal 54 and an output section 432 having the same configuration as that of the input section 542 of the current detection terminal 54. A part exposed to the outside of the input section 431 is connected to the circuit board mounted with the U-phase control device. The output section 432 is connected to the transistor 221 by a bonding wire 61*b*.

The current detection terminal 44 has the same configuration as that of the current detection terminal 54. More specifically, the current detection terminal 44 has an output section 441 having the same configuration as that of the output section 541 of the current detection terminal 54 and an input section 442 having the same configuration as that of the input section 542 of the current detection terminal 54. A part exposed to the outside of the output section 441 is connected to the circuit board mounted with the U-phase control device. The input section 442 is connected to the transistor 221 by a bonding wire 62*b*.

The gate signal output terminal 45 has the same configuration as that of the current detection terminal 54. More specifically, the gate signal output terminal 45 has an input section 451 having the same configuration as that of the output section 541 of the current detection terminal 54 and an output section 452 having the same configuration as that of the input section 542 of the current detection terminal 54. A part exposed to the outside of the input section 451 is connected to the circuit board mounted with the U-phase control device. The output section 452 is connected to the transistor 231 by a bonding wire 61*c*.

The current detection terminal 46 has the same configuration as that of the current detection terminal 54. More specifically, the current detection terminal 46 has an output section 461 having the same configuration as that of the output section 541 of the current detection terminal 54 and an input section 462 having the same configuration as that of the input section 542 of the current detection terminal 54. A part exposed to the outside of the output section 461 is connected to the circuit board mounted with the U-phase control device. The input section 462 is connected to the transistor 231 by a bonding wire 62*c*.

The gate signal output terminal 47 has the same configuration as that of the current detection terminal 54. More specifically, the gate signal output terminal 47 has an input section 471 having the same configuration as that of the output section 541 of the current detection terminal 54 and an output section 472 having the same configuration as that of the input section 542 of the current detection terminal 54. A part exposed to the outside of the input section 471 is connected to the circuit board mounted with the U-phase control device. The output section 472 is connected to the transistor 241 by a bonding wire 61*d*.

The current detection terminal 48 has the same configuration as that of the current detection terminal 54. More specifically, the current detection terminal 48 has an output section 481 having the same configuration as that of the output section 541 of the current detection terminal 54 and an input section 482 having the same configuration as that of the input section 542 of the current detection terminal 54. A part exposed to the outside of the output section 481 is connected to the circuit board mounted with the U-phase control device. The input section 482 is connected to the transistor 241 by a bonding wire 62*d*.

The gate signal output terminal 51 has the same configuration as that of the current detection terminal 54. More specifically, the gate signal output terminal 51 has an input section 511 having the same configuration as that of the output section 541 of the current detection terminal 54 and an output section 512 having the same configuration as that of the input section 542 of the current detection terminal 54. A part exposed to the outside of the input section 511 is connected to the circuit board mounted with the U-phase control device. The output section 512 is connected to the transistor 251 by a bonding wire 61*e*.

The current detection terminal 52 has the same configuration as that of the current detection terminal 54. More specifically, the current detection terminal 52 has an output section 521 having the same configuration as that of the output section 541 of the current detection terminal 54 and an input section 522 having the same configuration as that of the input section 542 of the current detection terminal 54. A part exposed to the outside of the output section 521 is connected to the circuit board mounted with the U-phase control device. The input section 522 is connected to the transistor 251 by a bonding wire 62*e*.

The gate signal output terminal 53 has the same configuration as that of the current detection terminal 54. More specifically, the gate signal output terminal 53 has an input section 531 having the same configuration as that of the output section 541 of the current detection terminal 54 and an output section 532 having the same configuration as that of the input section 542 of the current detection terminal 54. A part exposed to the outside of the input section 531 is connected to the circuit board mounted with the U-phase control device. The output section 532 is connected to the transistor 261 by a bonding wire 61*f*.

The gate signal output terminal 55 has the same configuration as that of the current detection terminal 54. More specifically, the gate signal output terminal 55 has an input section 551 having the same configuration as that of the output section 541 of the current detection terminal 54 and an output section 552 having the same configuration as that of the input section 542 of the current detection terminal 54. A part exposed to the outside of the input section 551 is connected to the circuit board mounted with the U-phase control device. The output section 552 is connected to the transistor 271 by a bonding wire 61*g*.

The current detection terminal 56 has the same configuration as that of the current detection terminal 54. More specifically, the current detection terminal 56 has an output section 561 having the same configuration as that of the output section 541 of the current detection terminal 54 and an input section 562 having the same configuration as that of the input section 542 of the current detection terminal 54. A part exposed to the outside of the output section 561 is connected to the circuit board mounted with the U-phase control device. The input section 562 is connected to the transistor 271 by a bonding wire 62*g*.

The gate signal output terminal 57 has the same configuration as that of the current detection terminal 54. More specifically, the gate signal output terminal 57 has an input section 571 having the same configuration as that of the output section 541 of the current detection terminal 54 and an output section 572 having the same configuration as that of the input section 542 of the current detection terminal 54. A part exposed to the outside of the input section 571 is connected to the circuit board mounted with the U-phase control device. The output section 572 is connected to the transistor 281 by a bonding wire 61*h*.

The current detection terminal 58 has the same configuration as that of the current detection terminal 54. More specifically, the current detection terminal 58 has an output section 581 having the same configuration as that of the output section 541 of the current detection terminal 54 and an input section 582 having the same configuration as that of the input section 542 of the current detection terminal 54. A part exposed to the outside of the output section 581 is connected to the circuit board mounted with the U-phase control device. The input section 582 is connected to the transistor 281 by a bonding wire 62*h*.

Herein, the connection relationships among the positive electrode terminal Pu, the negative electrode terminal Nu, the intermediate terminal Mu, the transistors 211 to 281, and the like provided in the semiconductor module 1A are described using FIGS. 2 and 4.

As illustrated in FIG. 2, the semiconductor module 1A includes the transistors 211, 221, 231, 241 and freewheel diodes 212, 222, 232, 242 arranged on the positive electrode side wiring pattern 141. The semiconductor module 1A includes the transistor 251, 261 and freewheel diodes 252, 262 arranged on the intermediate wiring pattern 142. The semiconductor module 1A includes the transistors 271, 281 and freewheel diodes 272, 282 arranged on the intermediate wiring pattern 143. Hereinafter, the freewheel diodes 212, 222, 232, 242, 252, 262, 272, 282 are sometimes abbreviated as "freewheel diodes 212 to 282".

As illustrated in FIG. 4, the transistors 211 to 281 contain an N-type metal-oxide-semiconductor field-effect transistor (MOSFET), for example. The freewheel diode 212 is connected to the transistor 211 in anti-parallel. A drain of the transistor 211 and a cathode of the freewheel diode 212 are connected, and a source of the transistor 211 and an anode of the freewheel diode 212 are connected. The transistor 211 and the freewheel diode 212 constitute a semiconductor element 21. In this embodiment, in the semiconductor element 21, the transistor 211 and the freewheel diode 212 are formed on different semiconductor substrates (not illustrated) (see FIG. 2) but the transistor 211 and the freewheel diode 212 may be formed on the same semiconductor substrate and integrated into one chip.

The freewheel diode 222 is connected to the transistor 221 in anti-parallel. A drain of the transistor 221 and a cathode of the freewheel diode 222 are connected, and a source of the transistor 221 and an anode of the freewheel diode 222 are connected. The transistor 221 and the freewheel diode 222 constitute a semiconductor element 22. In this embodiment, in the semiconductor element 22, the transistor 221 and the freewheel diode 222 are formed on different semiconductor substrates (not illustrated) (see FIG. 2) but the transistor 221 and the freewheel diode 222 may be formed on the same semiconductor substrate and integrated into one chip.

The transistors 211 to 281 and the freewheel diodes 212 to 282 have a trench structure. The transistors 211 to 281 each have a gate and a source exposed to a first surface and a drain exposed to the back surface of the first surface. The gate and the source are insulated from each other in the first surface. The freewheel diodes 212 to 282 each have an anode exposed to a first surface and a cathode exposed to the back surface of the first surface.

As illustrated in FIG. 2, the transistor 211 is mechanically and electrically connected to a first portion 141*a* by soldering of the drain (not illustrated) exposed to the outside by a solder (not illustrated) formed in a predetermined place of the first portion 141*a* of the positive electrode side wiring pattern 141. The freewheel diode 212 is mechanically and electrically connected to the first portion 141*a* by soldering of the cathode (not illustrated) exposed to the outside by a solder (not illustrated) formed in a predetermined place of the first portion 141*a* of the positive electrode side wiring pattern 141. Thus, the drain of the transistor 211 and the cathode of the freewheel diode 212 are electrically connected to each other via the first portion 141*a* of the positive electrode side wiring pattern 141.

The transistor 221 is mechanically and electrically connected to the first portion 141*a* by soldering of the drain (not illustrated) exposed to the outside by a solder 85 (see FIG. 3) formed in a predetermined place of the first portion 141*a* of the positive electrode side wiring pattern 141. The freewheel diode 222 is mechanically and electrically connected to the first portion 141*a* by soldering of the cathode (not illustrated) exposed to the outside by the solder 85 (see FIG. 3) formed in a predetermined place of the first portion 141*a* of the positive electrode side wiring pattern 141. Thus, the drain of the transistor 221 and the cathode of the freewheel diode 222 are electrically connected to each other via the first portion 141*a* of the positive electrode side wiring pattern 141.

Thus, the drain of the transistor 211, the cathode of the freewheel diode 212, the drain of the transistor 221, and the cathode of the freewheel diode 222 are connected to the positive electrode side wiring pattern 141. Thus, the drain of the transistor 211, the cathode of the freewheel diode 212, the drain of the transistor 221, and the cathode of the freewheel diode 222 are electrically connected to the positive electrode terminal Pu via the positive electrode side wiring pattern 141.

As illustrated in FIG. 2, the source of the transistor 211 and an anode of the freewheel diode 212 are electrically connected to each other by a bonding wire 63*a*. The anode of the freewheel diode 212 is electrically connected to the intermediate wiring pattern 142 by a bonding wire 64*a*. The source of the transistor 221 and an anode of the freewheel diode 222 are electrically connected to each other by a bonding wire 63*b*. The anode of the freewheel diode 222 is electrically connected to the intermediate wiring pattern 142 by a bonding wire 64*b*. The bonding wires 63*a*, 63*b*, 64*a*, 64*b* each contain a plurality of wires (three wires in this embodiment), for example.

Thus, the source of the transistor 211, the anode of the freewheel diode 212, the source of the transistor 221, and the anode of the freewheel diode 222 are connected to each other by the bonding wires 63*a*, 63*b*, 64*a*, 64*b* and the intermediate wiring pattern 142. Thus, the source of the transistor 211, the anode of the freewheel diode 212, the source of the transistor 221, and the anode of the freewheel diode 222 are electrically connected to the intermediate terminal Mu via the bonding wires 63*a*, 63*b*, 64*a*, 64*b* and the intermediate wiring pattern 142.

Returning to FIG. 4, the freewheel diode 232 is connected to the transistor 231 in anti-parallel. The transistor 231 and the freewheel diode 232 constitute a semiconductor element 23. In this embodiment, in the semiconductor element 23, the transistor 231 and the freewheel diode 232 are formed on different semiconductor substrates (not illustrated) (see FIG. 2) but the transistor 231 and the freewheel diode 232 may be formed on the same semiconductor substrate and integrated into one chip.

The freewheel diode 242 is connected to the transistor 241 in anti-parallel. The transistor 241 and the freewheel diode 242 constitute a semiconductor element 24. In this embodiment, in the semiconductor element 24, the transistor 241 and the freewheel diode 242 are formed on different semiconductor substrates (not illustrated) (see FIG. 2) but the transistor 241 and the freewheel diode 242 may be formed on the same semiconductor substrate and integrated into one chip.

As illustrated in FIG. 2, the semiconductor element 23 has the same configuration as that of the semiconductor element 21 when the transistor 211 is replaced with the transistor 231, the freewheel diode 212 is replaced with the freewheel diode 232, the bonding wire 63*a* is replaced with the bonding wire 63*c*, the bonding wire 64*a* is replaced with the bonding wire 64*c*, and the intermediate wiring pattern 142 is replaced with the intermediate wiring pattern 143.

The semiconductor element 24 has the same configuration as that of the semiconductor element 22 when the transistor 221 is replaced with the transistor 241, the freewheel diode 222 is replaced with the freewheel diode 242, the bonding wire 63*b* is replaced with the bonding wire 63*d*, the bonding wire 64*b* is replaced with the bonding wire 64*d*, and the intermediate wiring pattern 142 is replaced with the intermediate wiring pattern 143.

Therefore, the drain of the transistor 211, the cathode of the freewheel diode 212, the drain of the transistor 221, the cathode of the freewheel diode 222, the drain of the transistor 231, the cathode of the freewheel diode 232, the drain of the transistor 241, and the cathode of the freewheel diode 242 are connected via the first portion 141*a* of the positive electrode side wiring pattern 141.

As illustrated in FIG. 2, the intermediate wiring pattern 142 and the intermediate wiring pattern 143 are connected by the intermediate terminal Mu. Therefore, the source of the transistor 211, the anode of the freewheel diode 212, the source of the transistor 221, the anode of the freewheel diode 222, the source of the transistor 231, the anode of the freewheel diode 232, the source of the transistor 241, and the anode of the freewheel diode 242 are connected via the bonding wires 64*a*, 64*b*, 64*c*, 64*d*, the intermediate wiring patterns 142, 143, and the intermediate terminal Mu.

Thus, the transistor 211, the freewheel diode 212, the transistor 221, the freewheel diode 222, the transistor 231, the freewheel diode 232, the transistor 241, and the freewheel diode 242 are connected in parallel between the positive electrode terminal Pu and the intermediate terminal Mu. Therefore, the semiconductor elements 21, 22, 23, 24 are connected in parallel between the positive electrode terminal Pu and the intermediate terminal Mu to form the upper arm Uup.

Returning to FIG. 4, the freewheel diode 252 is connected to the transistor 251 in anti-parallel. The transistor 251 and the freewheel diode 252 constitute a semiconductor element 25. In this embodiment, in the semiconductor element 25, the transistor 251 and the freewheel diode 252 are formed on different semiconductor substrates (not illustrated) (see FIG. 2) but the transistor 251 and the freewheel diode 252 may be formed on the same semiconductor substrate and integrated into one chip.

The freewheel diode 262 is connected to the transistor 261 in anti-parallel. The transistor 261 and the freewheel diode 262 constitute a semiconductor element 26. In this embodiment, in the semiconductor element 26, the transistor 261 and the freewheel diode 262 are formed on different semiconductor substrates (not illustrated) (see FIG. 2) but the transistor 261 and the freewheel diode 262 may be formed on the same semiconductor substrate and integrated into one chip.

The freewheel diode 272 is connected to the transistor 271 in anti-parallel. The transistor 271 and the freewheel diode

272 constitute a semiconductor element 27. In this embodiment, in the semiconductor element 27, the transistor 271 and the freewheel diode 272 are formed on different semiconductor substrates (not illustrated) (see FIG. 2) but transistor 271 and the freewheel diode 272 may be formed on the same semiconductor substrate and integrated into one chip.

The freewheel diode 282 is connected to the transistor 281 in anti-parallel. The transistor 281 and the freewheel diode 282 constitute a semiconductor element 28. In this embodiment, in the semiconductor element 28, the transistor 281 and the freewheel diode 282 are formed on different semiconductor substrates (not illustrated) (see FIG. 2) but the transistor 281 and the freewheel diode 282 may be formed on the same semiconductor substrate and integrated into one chip.

As illustrated in FIG. 2, the semiconductor element 25 has the same configuration as that of the semiconductor element 21 when the transistor 211 is replaced with the transistor 251, the freewheel diode 212 is replaced with the freewheel diode 252, the bonding wire 63*a* is replaced with the bonding wire 65*a*, the bonding wire 64*a* is replaced with the bonding wire 66*a*, the first portion 141*a* of the positive electrode side wiring pattern 141 is replaced with the intermediate wiring pattern 142, and the intermediate wiring pattern 142 is replaced with the negative electrode side wiring pattern 144.

The semiconductor element 26 has the same configuration as that of the semiconductor element 22 when the transistor 221 is replaced with the transistor 261, the freewheel diode 222 is replaced with the freewheel diode 262, the bonding wire 63*b* is replaced with the bonding wire 65*b*, the bonding wire 64*b* is replaced with the bonding wire 66*b*, and the intermediate wiring pattern 142 is replaced with the negative electrode side wiring pattern 144.

The semiconductor element 27 has the same configuration as that of the semiconductor element 21 when the transistor 211 is replaced with the transistor 271, the freewheel diode 212 is replaced with the freewheel diode 272, the bonding wire 63*a* is replaced with the bonding wire 65*c*, the bonding wire 64*a* is replaced with the bonding wire 66*c*, the first portion 141*a* of the positive electrode side wiring pattern 141 is replaced with the intermediate wiring pattern 143, and the intermediate wiring pattern 142 is replaced with the negative electrode side wiring pattern 144.

The semiconductor element 28 has the same configuration as that of the semiconductor element 22 when the transistor 221 is replaced with the transistor 281, the freewheel diode 222 is replaced with the freewheel diode 282, the bonding wire 63*b* is replaced with the bonding wire 65*d*, the bonding wire 64*b* is replaced with the bonding wire 66*d*, the first portion 141*a* of the positive electrode side wiring pattern 141 is replaced with the intermediate wiring pattern 143, and the intermediate wiring pattern 142 is replaced with the negative electrode side wiring pattern 144.

The intermediate wiring pattern 142 and the intermediate wiring pattern 143 are connected by the intermediate terminal Mu. Therefore, the drain of the transistor 251, the cathode of the freewheel diode 252, the drain of the transistor 261, the cathode of the freewheel diode 262, the drain of the transistor 271, the cathode of the freewheel diode 272, the drain of the transistor 281, and the cathode of the freewheel diode 282 are connected via the intermediate wiring patterns 142, 143 and intermediate wiring pattern intermediate terminal Mu.

The source of the transistor 251, the anode of the freewheel diode 252, the source of the transistor 261, the anode of the freewheel diode 262, the source of the transistor 271, the anode of the freewheel diode 272, the source of the transistor 281, and the anode of the freewheel diode 282 are connected via the bonding wires 65a, 65b, 65c, 65d, 66a, 66b, 66c, 66d and the negative electrode side wiring pattern 144.

Thus, the transistor 251, the freewheel diode 252, the transistor 261, the freewheel diode 262, the transistor 271, the freewheel diode 272, the transistor 281, and the freewheel diode 282 are connected in parallel between the intermediate terminal Mu and the negative electrode terminal Nu. Therefore, the semiconductor elements 25, 26, 27, 28 are connected in parallel between the intermediate terminal Mu and the negative electrode terminal Nu to form the lower arm Ulo.

When the connection relationships among the semiconductor elements 21, 22, 23, 24, 25, 26, 27, 28, the positive electrode terminal Pu, the negative electrode terminal Nu, and the intermediate terminal Mu are structurally viewed, the semiconductor elements 21, 22 connected in parallel and the semiconductor elements 25, 26 connected in parallel are connected in series between the positive electrode terminal Pu and the negative electrode terminal Nu. The semiconductor elements 23, 24 connected in parallel and the semiconductor elements 27, 28 connected in parallel are connected in series between the positive electrode terminal Pu and the negative electrode terminal Nu. The semiconductor elements 21, 22, 25, 26 connected in series between the positive electrode terminal Pu and the negative electrode terminal Nu and the semiconductor elements 23, 24, 27, 28 connected in series between the positive electrode terminal Pu and the negative electrode terminal Nu are connected by the intermediate terminal Mu. Therefore, when the connection relationships among the semiconductor elements 21, 22, 23, 24, 25, 26, 27, 28, the positive electrode terminal Pu, the negative electrode terminal Nu, and the intermediate terminal Mu are electrically viewed, the semiconductor elements 21, 22, 23, 24 connected in parallel and the semiconductor elements 25, 26, 27, 28 connected in parallel are connected in series between the positive electrode terminal Pu and the negative electrode terminal Nu. In the semiconductor elements 21, 22, 23, 24 connected in parallel and the semiconductor elements 25, 26, 27, 28 connected in parallel, the intermediate terminal Mu is connected to the connection portion between the positive electrode terminal Pu and the negative electrode terminal Nu.

As illustrated in FIG. 2, one end of the bonding wire 61a is joined to the gate of the transistor 211. The other end of the bonding wire 61a is joined to the output section 412 of gate signal output terminal 41. By the connection between the gate of the transistor 211 and the gate signal output terminal 41, a gate signal input from the U-phase control device into the input section 411 of the gate signal output terminal 41 is output from the output section 412 of the gate signal output terminal 41 to the gate of the transistor 211 via the bonding wire 61a.

One end of the bonding wire 62a is joined to a source (auxiliary source) of a current detecting transistor (not illustrated) provided in the transistor 211. The other end of the bonding wire 62a is joined to the input section 422 of the current detection terminal 42. By the connection between the source of the current detecting transistor and the current detection terminal 42, a current flowing from the source of the current detecting transistor is input into the U-phase control device.

One end of the bonding wire 61b is joined to the gate of the transistor 221. The other end of the bonding wire 61b is joined to the output section 432 of the gate signal output terminal 43. By the connection between the gate of the transistor 221 and the gate signal output terminal 43, a gate signal input from the U-phase control device into the input section 431 of the gate signal output terminal 43 is output from the output section 432 of the gate signal output terminal 43 to the gate of the transistor 221 via the bonding wire 61b.

One end of the bonding wire 62b is joined to a source (auxiliary source) of a current detecting transistor (not illustrated) provided in the transistor 221. The other end of the bonding wire 62b is joined to the input section 442 of the current detection terminal 44. By the connection between the source of the current detecting transistor and the current detection terminal 44, a current flowing from the source of the current detecting transistor is input into the U-phase control device.

One end of the bonding wire 61c is joined to the gate of the transistor 231. The other end of the bonding wire 61c is joined to the output section 452 of the gate signal output terminal 45. By the connection between the gate of the transistor 231 and the gate signal output terminal 45, a gate signal input from the U-phase control device into the input section 451 of the gate signal output terminal 45 is output from the output section 452 of the gate signal output terminal 45 to the gate of the transistor 231 via the bonding wire 61c.

One end of the bonding wire 62c is joined to a source (auxiliary source) of a current detecting transistor (not illustrated) provided in the transistor 231. The other end of the bonding wire 62c is joined to the input section 462 of the current detection terminal 46. By the connection between the source of the current detecting transistor and the current detection terminal 46, a current flowing from the source of the current detecting transistor is input into the U-phase control device.

One end of the bonding wire 61d is joined to the gate of the transistor 241. The other end of the bonding wire 61d is joined to the output section 472 of the gate signal output terminal 47. By the connection between the gate of the transistor 241 and the gate signal output terminal 47, a gate signal input from the U-phase control device into the input section 471 of the gate signal output terminal 47 is output from the output section 472 of the gate signal output terminal 47 to the gate of the transistor 241 via the bonding wire 61d.

One end of the bonding wire 62d is joined to a source (auxiliary source) of a current detecting transistor (not illustrated) provided in the transistor 241. The other end of the bonding wire 62d is joined to the input section 482 of the current detection terminal 48. By the connection between the source of the current detecting transistor and the current detection terminal 48, a current flowing from the source of the current detecting transistor is input into the U-phase control device.

One end of the bonding wire 61e is joined to the gate of the transistor 251. The other end of the bonding wire 61e is joined to the output section 512 of the gate signal output terminal 51. By the connection between the gate of the transistor 251 and the gate signal output terminal 51, a gate signal input from the U-phase control device into the input section 511 of the gate signal output terminal 51 is output from the output section 512 of the gate signal output terminal 51 to the gate of the transistor 251 via the bonding wire 61e.

One end of the bonding wire 62e is joined to a source (auxiliary source) of a current detecting transistor (not illustrated) provided in the transistor 251. The other end of the bonding wire 62e is joined to the input section 522 of the current detection terminal 52. By the connection between the source of the current detecting transistor and the current detection terminal 52, a current flowing from the source of the current detecting transistor is input into the U-phase control device.

One end of the bonding wire 61f is joined to the gate of the transistor 261. The other end of the bonding wire 61f is joined to the output section 532 of the gate signal output terminal 53. By the connection between the gate of the transistor 261 and the gate signal output terminal 53, a gate signal input from the U-phase control device into the input section 531 of the gate signal output terminal 53 is output from the output section 532 of the gate signal output terminal 53 to the gate of the transistor 261 via the bonding wire 61f.

One end of the bonding wire 62f is joined to a source (auxiliary source) of a current detecting transistor (not illustrated) provided in the transistor 261. The other end of the bonding wire 62f is joined to the input section 542 of the current detection terminal 54. By the connection between the source of the current detecting transistor and the current detection terminal 54, a current flowing from the current detecting transistor is input into the U-phase control device.

One end of the bonding wire 61g is joined to the gate of the transistor 271. The other end of the bonding wire 61g is joined to the output section 552 of the gate signal output terminal 55. By the connection between the gate of the transistor 271 and the gate signal output terminal 55, a gate signal input from the U-phase control device into the input section 551 of the gate signal output terminal 55 is output from the output section 552 of the gate signal output terminal 55 to the gate of the transistor 271 via the bonding wire 61g.

One end of the bonding wire 62g is joined to a source (auxiliary source) of a current detecting transistor (not illustrated) provided in the transistor 271. The other end of the bonding wire 62g is joined to the input section 562 of the current detection terminal 56. By the connection between the source of the current detecting transistor and the current detection terminal 56, a current flowing from the current detecting transistor is input into the U-phase control device.

One end of the bonding wire 61h is joined to the gate of the transistor 281. The other end of the bonding wire 61h is joined to the output section 572 of the gate signal output terminal 57. By the connection between the gate of the transistor 281 and the gate signal output terminal 57, a gate signal input from the U-phase control device into the input section 571 of the gate signal output terminal 57 is output from the output section 572 of the gate signal output terminal 57 to the gate of the transistor 281 via the bonding wire 61h.

One end of the bonding wire 62h is joined to a source (auxiliary source) of a current detecting transistor (not illustrated) provided in the transistor 281. The other end of the bonding wire 62h is joined to the input section 582 of the current detection terminal 58. By the connection between the source of the current detecting transistor and the current detection terminal 58, a current flowing from the current detecting transistor is input into the U-phase control device.

The gate signal is a pulse-like signal. The same gate signal is input into each of the transistors 211, 221, 231, 241. A potential difference between the low potential level and the high potential level of the gate signals output from the gate signal output terminals 41, 43, 45, 47 becomes a gate-source voltage to be applied to the transistors 211, 221, 231, 241.

Therefore, when the potential level of the gate signals output from the gate signal output terminals 41, 43, 45, 47 is a high potential level, the transistors 211, 221, 231, 241 are turned on (conduction state). On the other hand, when the potential level of the gate signals output from the gate signal output terminals 41, 43, 45, 47 is a low potential level, the transistors 211, 221, 231, 241 are turned off (non-conduction state).

The same gate signal is input into each of the transistors 251, 261, 271, 281. A potential difference between the low potential level and the high potential level of the gate signals output from the gate signal output terminals 51, 53, 55, 57 becomes a gate-source voltage to be applied to the transistors 251, 261, 271, 281. Therefore, when the potential level of the gate signals output from the gate signal output terminals 51, 53, 55, 57 is a high potential level, the transistors 251, 261, 271, 281 are turned on (conduction state). On the other hand, when the potential level of the gate signals output from the gate signal output terminals 51, 53, 55, 57 is a low potential level, the transistors 251, 261, 271, 281 are turned off (non-conduction state).

The gate signals output from the gate signal output terminals 41, 43, 45, 47 are signals having polarities opposite to those of the gate signals output from the gate signal output terminals 51, 53, 55, 57. Therefore, the U-phase control device controls On/Off of the transistors 211, 221, 231, 241 in a predetermined cycle and controls Off/On of the transistors 251, 261, 271, 281 in the cycle, which enables the U-phase inverter section 12u to convert a DC voltage to be applied between the positive electrode terminal Pu and the negative electrode terminal Nu into an AC voltage and output the AC voltage from the intermediate terminal Mu to the load.

(Configurations and Effects of Structures Provided in Semiconductor Module)

Figures 5A, 5B:
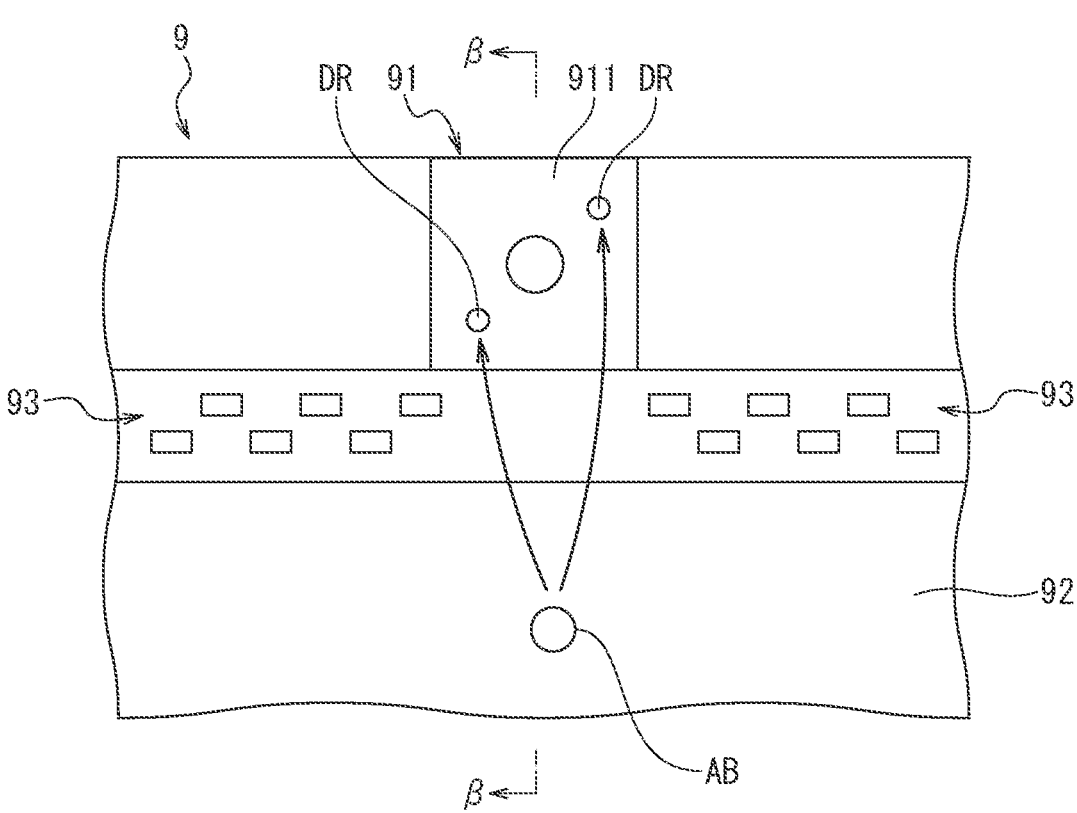
FIGS. 5A and 5B are diagrams for explaining the effects of the semiconductor module according to the first embodiment of the present invention and are diagrams schematically illustrating the vicinity of an intermediate terminal of a conventional semiconductor module.
Figure 6:
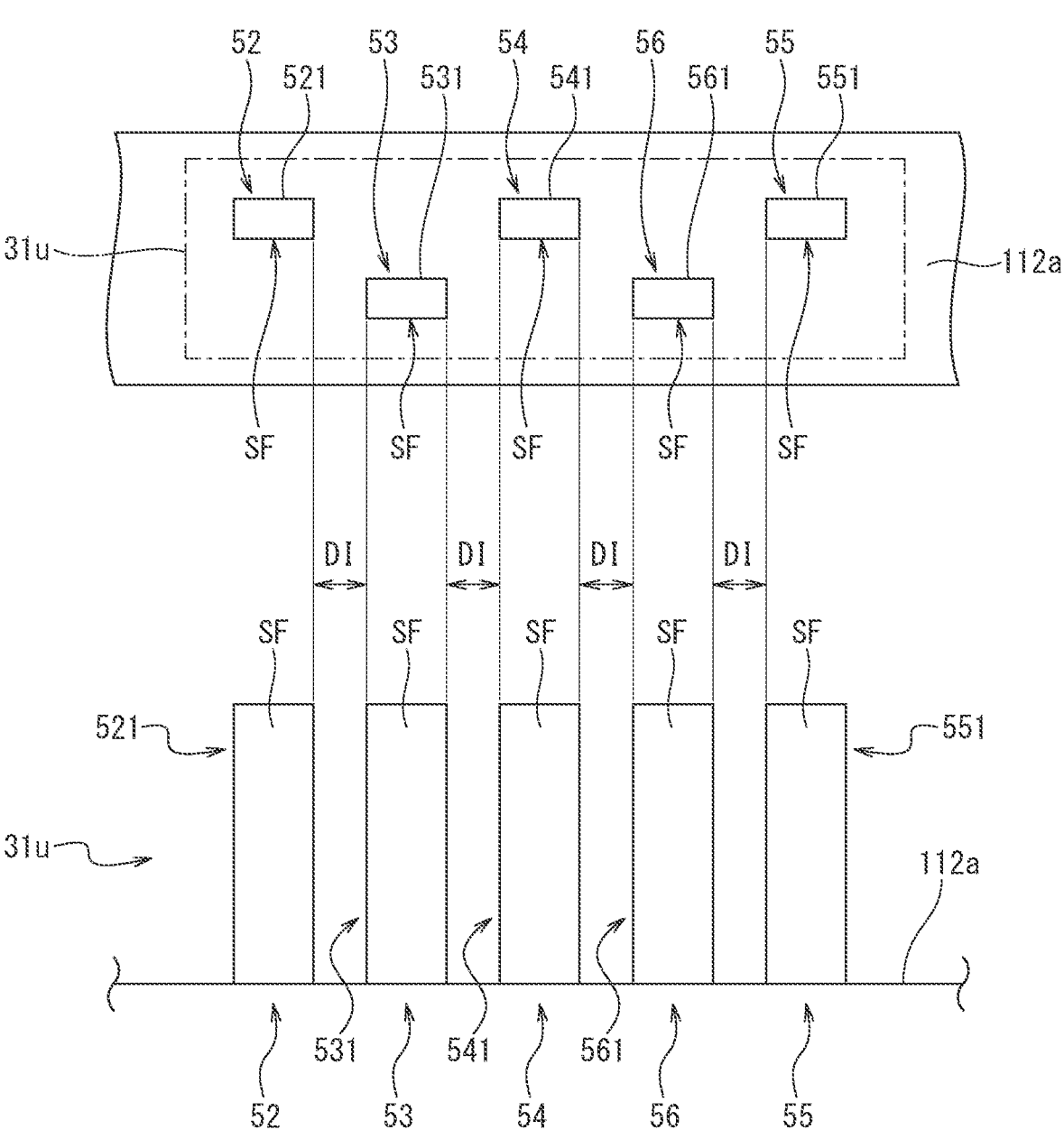
FIG. 6 is a diagram for explaining the configuration and the effects of a structure of the semiconductor module according to the first embodiment of the present invention and is an enlarged view schematically illustrating the vicinity of the structure.

The configurations and effects of the structure 31u provided in the semiconductor module 1A according to this embodiment are described using FIGS. 5 and 6 referring to FIGS. 1 to 3. FIG. 5A is a view of the vicinity of an intermediate terminal 91 of a conventional semiconductor module 9 as a comparative example viewed in a direction orthogonal to a fastening surface 911 of the intermediate terminal 91. FIG. 5B is a schematic cross-sectional view of the semiconductor module 9 cut along the β-β line illustrated in FIG. 5A. In an upper part of FIG. 6, the structure 31u viewed in the direction orthogonal to the fastening surface 751 (not illustrated in FIG. 6) of the intermediate terminal Mu is illustrated. In a lower part of FIG. 6, the structure 31u viewed in a direction parallel to the fastening surface 751 (not illustrated in FIG. 6) of the intermediate terminal Mu (i.e., a direction in which the sealing section 81u and the intermediate terminal Mu are arranged) is illustrated.

As illustrated in FIG. 1, the structure 31u provided in the semiconductor module 1A is arranged between the sealing section 81u and the fastening surface 751 of the intermediate terminal Mu. The structure 31u has the gate signal output terminals 53, 55 and the current detection terminals 52, 54, 56. As illustrated in FIG. 3, the input section 531 (an example of the at least a part) of the gate signal output terminal 53 and the output section 541 of the current detection terminal 54 are higher than the surface 811 of the sealing section 81u and the fastening surface 751 of the intermediate terminal Mu with the surface 114 of the case 11 as a reference. The gate signal output terminal 55 and the current detection terminals 52, 56 have the same configuration as that of the current detection terminal 54. Therefore, the input section 551 (an example of the at least a part) of the gate signal output terminal 55 and the output sections 521, 561 of the current detection terminals 52, 56, respectively, are higher than the surface 811 of the sealing section 81u and the fastening surface 751 of the intermediate terminal Mu with the surface 114 of the case 11 as a reference. Therefore, the structure 31u is arranged to shield the fastening surface 751 of the intermediate terminal Mu by the gate signal output terminals 53, 55 and the current detection terminals 52, 54, 56 when viewed from the sealing section 81u side.

When a resin material, such as an epoxy resin, is cast in a casting region, an unexpected bubble is sometimes generated. The casting, i.e., sealing, of the resin material is carried out under reduced pressure. Therefore, when the resin material is cast, droplets of the resin material formed by the breakage of the bubble are sometimes scattered far away such that the droplets reach a peripheral portion of a case with a place where the bubbles are broken as the starting point.

As illustrated in FIG. 5A, a control terminal group 93 including gate signal output terminals and current detection terminals is not arranged between a sealing section 92 and the intermediate terminal 91 in the conventional semiconductor module 9, unlike the semiconductor module 1A according to this embodiment. Therefore, the semiconductor module 9 has a gap substantially equal to the width of the fastening surface 911 of the intermediate terminal 91 between the sealing section 92 and the intermediate terminal 91.

Therefore, when a bubble AB generated in casting an epoxy resin, for example, to form the sealing section 92 is broken and droplets DR are scattered, the droplets DR sometimes adhere to the fastening surface 911 of the intermediate terminal 91 through the gap present between the sealing section 92 and the intermediate terminal 91 as illustrated in FIGS. 5A and 5B. The resin material for forming the sealing section 92 is an insulating material. Therefore, the adhesion of the droplets DR to the fastening surface 911 increases the contact resistance between the fastening surface 911 and a cable fastened to the intermediate terminal 91. A large current (for example, several tens to several hundreds of amps) to be supplied to a load as a drive target of the semiconductor module 9 flows to the intermediate terminal 91, which poses problems, such as the heat generation in the intermediate terminal 91 due to the increase in contact resistance caused by the droplets DR and the inability to cause a desired current to flow to the load. The droplets DR have a size of about several hundreds of micrometers, for example, and thus are difficult to confirm with the naked eye. Therefore, the semiconductor module 9 also has a problem that, even when the droplets DR adhere to the fastening surface 911, a worker who fastens the cable to the intermediate terminal 91 fastens the cable to the intermediate terminal 91 without noticing the droplets DR.

To address the problem, the semiconductor module 1A includes the structure 31u having the gate signal output terminals 53, 55 and the current detection terminals 52, 54, 56 arranged to shield the fastening surface 751 of the intermediate terminal Mu. As illustrated in FIG. 2, the gate signal output terminals 41 to 57 are arranged in a plurality of rows in the direction in which the sealing section 81u and the intermediate terminal Mu are arranged, and each have a surface SF (see FIG. 6) having a predetermined spread in each of the input sections 411 to 571 (an example of the part), respectively, when viewed in the direction in which the sealing section 81u and the intermediate terminal Mu are arranged. Similarly, the current detection terminals 42 to 58 are arranged in a plurality of rows in the direction in which the sealing section 81u and the intermediate terminal Mu are arranged and each have a surface SF (see FIG. 6) having a predetermined spread in each of the output sections 421 to 581, respectively, when viewed in the direction in which the sealing section 81u and the intermediate terminal Mu are arranged. Therefore, even when the bubble AB is generated in casting an epoxy resin, for example, in the casting region 113u to form the sealing section 81u, and the generated bubble AB is broken and the droplets DR are scattered toward the intermediate terminal Mu, the droplets DR adhere to at least one of the surfaces SF of the gate signal output terminals 53, 55 and the current detection terminals 52, 54, 56 as illustrated in FIG. 3.

The gate signal output terminals 41 to 57 adjacent to each other when viewed in the direction in which the sealing section 81u and the intermediate terminal Mu are arranged are arranged not to overlap each other. Similarly, the current detection terminals 42 to 58 adjacent to each other when viewed in the direction in which the sealing section 81u and the intermediate terminal Mu are arranged are arranged not to overlap each other. More specifically, a distance DI between the current detection terminal 54 and the current detection terminal 56 is 0.5 mm or less, for example, as illustrated in FIG. 6. A distance DI between the current detection terminal 52 and the gate signal output terminal 53, a distance DI between the gate signal output terminal 53 and the current detection terminal 54, and a distance DI between the current detection terminal 56 and the gate signal output terminal 55 each are 0.5 mm or less, for example. Although not illustrated, the distances between the adjacent gate signal output terminals, the distances between the adjacent current detection terminals, and the distances between the gate signal output terminals and the current detection terminals adjacent to each other, other than the gate signal output terminals 53, 55 and the current detection terminals 52, 54, 56, are also 0.5 mm or less, for example.

Between the gate signal output terminals 53, 55 and the current detection terminals 52, 54, 56, and the intermediate terminal Mu, conductive substances, such as terminals having a workload larger than that of the gate signal output terminals 53, 55 and the current detection terminals 52, 54, 56, are not present. The droplets DR have a property of being drawn to conductive substances. Therefore, even when the gate signal output terminals 53, 55 and the current detection terminals 52, 54, 56 each are arranged with the distance DI from the adjacent terminal when viewed in the direction in which the sealing section 81u and the intermediate terminal Mu are arranged (i.e., a direction in which the droplets DR move toward the intermediate terminal Mu side), the droplets DR are drawn to the gate signal output terminals 53, 55 and the current detection terminals 52, 54, 56 and adhere to any of the surfaces SF of the gate signal output terminals 53, 55 and the current detection terminals 52, 54, 56.

Thus, in the semiconductor module 1A, the structure 31u can prevent the droplets DR from reaching the fastening surface 751 of the intermediate terminal Mu. As a result, the semiconductor module 1A can prevent the increase in contact resistance between the fastening surface 751 of intermediate terminal Mu and the cable, and therefore can prevent the heat generation in the intermediate terminal Mu and can cause a desired current to flow to the load from the U-phase inverter section 12u. Further, the semiconductor module 1A prevents the adhesion of the droplets DR to the fastening surface 751 of the intermediate terminal Mu, and therefore is free from the problem that a worker who fastens the cable to the intermediate terminal Mu fastens the cable to the intermediate terminal Mu without noticing the droplets DR.

The semiconductor module 1A includes a structure 31v having the same configuration as that of the structure 31u in the V-phase inverter section 12v and a structure 31w having the same configuration as that of the structure 31u in the W-phase inverter section 12w, as with the U-phase inverter section 12u. Thus, the semiconductor module 1A can prevent the droplets DR from adhering to the intermediate terminals Mv, Mw, and therefore can prevent the heat generation in the intermediate terminals Mv, Mw, and can cause a desired current to flow to the load from each of the V-phase inverter section 12v and W-phase inverter section 12w, respectively. Further, the semiconductor module 1A is free from the problem that a worker who fastens the cable to the intermediate terminal Mu fastens cables to the intermediate terminals Mv, Mw without noticing the droplets DR.

To the gate signal output terminals 41 to 57 and the current detection terminals 42 to 58, a current smaller than the current flowing to the intermediate terminal Mu flows, and a voltage lower than the voltage applied to the intermediate terminal Mu is applied. Therefore, even when the droplets DR adhere to the gate signal output terminals 41 to 57 and the current detection terminals 42 to 58, problems, such as the heat generation and the inability to transmit desired gate signals and to the transistors 211 to 281 and the inability to input currents flowing from the current detecting transistors to the control device, do not occur.

The structures 31u, 31v, 31w may have at least any of the gate signal output terminals 41 to 57 arranged between the sealing sections 81u, 81v, 81w and the intermediate terminals Mu, Mv, Mw to shield the fastening surfaces 751 of the intermediate terminals Mu, Mv, Mw to the sealing sections 81u, 81v, 81w, respectively. Therefore, the structures 31u, 31v, 31w may have the terminals arranged between the sealing sections 81u, 81v, 81w and the intermediate terminals Mu, Mv, Mw, respectively, according to the arrangement of the gate signal output terminals 41 to 57. The structures 31u, 31v, 31w may have the terminals arranged between the sealing sections 81u, 81v, 81w and the intermediate terminals Mu, Mv, Mw, respectively, and one or two or more terminals arranged on both sides of the terminals among the gate signal output terminals 41 to 57. The structures 31u, 31v, 31w may have the terminals arranged between the sealing sections 81u, 81v, 81w and the intermediate terminals Mu, Mv, Mw, respectively, and residual terminals among the gate signal output terminals 41 to 57.

(Modification)

Figure 7:
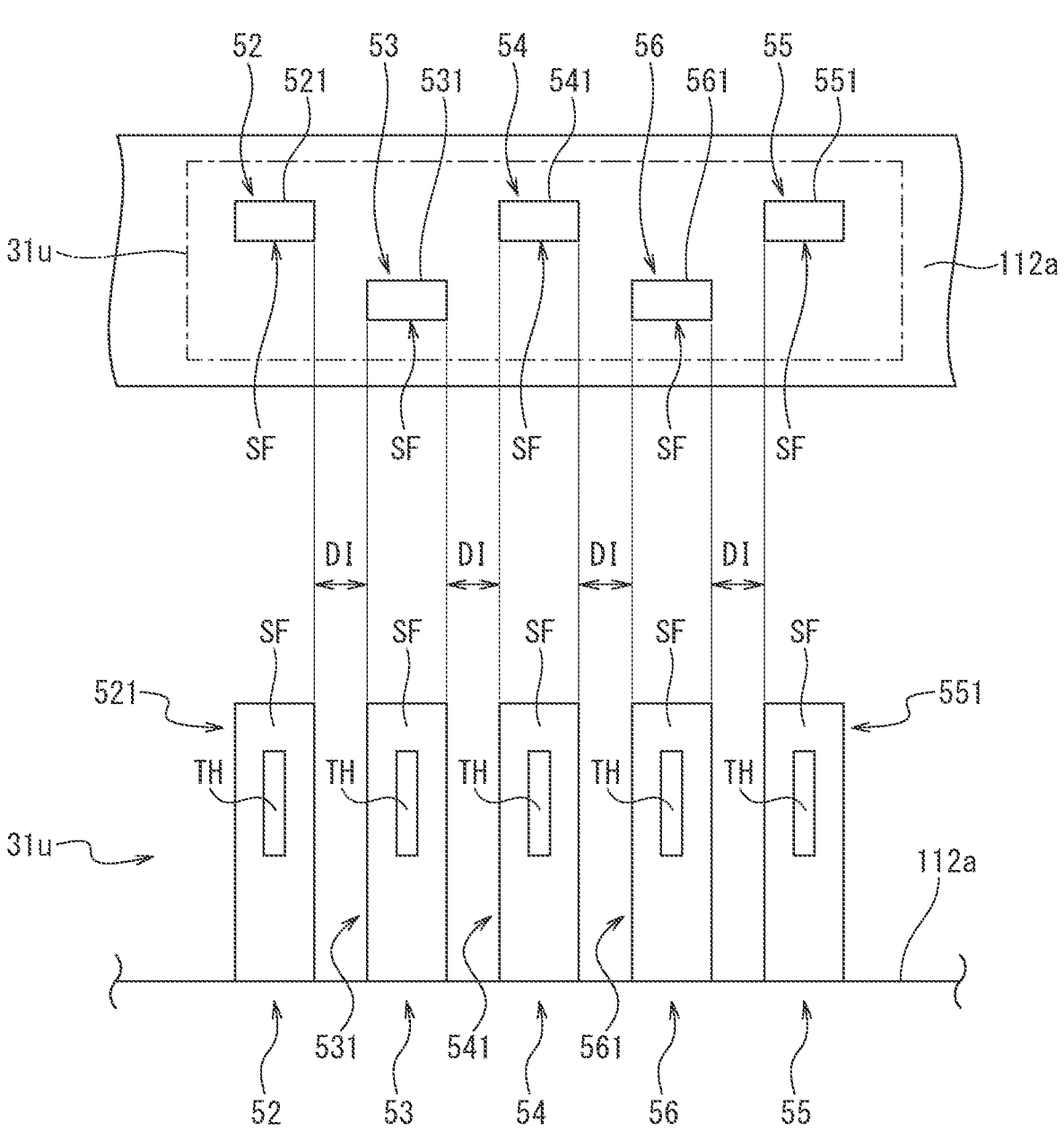
FIG. 7 is an enlarged view schematically illustrating an example of a plurality of control terminals provided in a structure of a semiconductor module according to a modification of the first embodiment of the present invention.

A semiconductor module according to a modification of this embodiment is described using FIG. 7. The semiconductor module according to this modification has a feature in that the structures of gate signal output terminals and current detection terminals are different from the structures of the gate signal output terminals 41 to 57 and the current detection terminals 42 to 58 in the first embodiment. The semiconductor module according to this modification has the same structure as that of the semiconductor module 1A according to the first embodiment, except for a difference in the structures of the gate signal output terminals and the current detection terminals. Therefore, the semiconductor module according to this modification is described using the same reference numerals as those of the constituent components of the semiconductor module 1A according to the first embodiment for constituent components other than the gate signal output terminals and the current detection terminals among constituent components constituting the semiconductor module according to this modification.

FIG. 7 is an enlarged schematic diagram illustrating the vicinity of the structure 31u provided in the semiconductor module according to this modification. In an upper part of FIG. 7, the structure 31u viewed in a direction orthogonal to the fastening surface 751 (not illustrated in FIG. 7) of the intermediate terminal Mu is illustrated. In a lower part of FIG. 7, the structure 31u viewed in a direction parallel to the fastening surface 751 (not illustrated in FIG. 7) of the intermediate terminal Mu (i.e., a direction in which the sealing section 81u and the intermediate terminal Mu are arranged) is illustrated.

The gate signal output terminals 41 to 57 and the current detection terminals 42 to 58 in this modification are press-fit terminals. Therefore, as illustrated in FIG. 7, each of the gate signal output terminals 41 to 57 and the current detection terminals 42 to 58 (FIG. 7 illustrates only the gate signal output terminals 53, 55 and the current detection terminals 52, 54, 56.) has a through hole TH penetrating an input section (an example of the part) in the direction in which the sealing section 81u (not illustrated in FIG. 7) and the intermediate terminal Mu are arranged.

The gate signal output terminals 41 to 57 and the current detection terminals 42 to 58 are kept in contact with a circuit board by the sidewalls. Therefore, even when droplets of the sealing resin of the sealing section 81u adhere to the surfaces SF of the gate signal output terminals 41 to 57 and the current detection terminals 42 to 58, problems of the inability to output gate signals to the transistors 211 to 281 and the inability to input currents flowing from the current detecting transistors to the control device does not occur. Therefore, the semiconductor module according to this modification obtains the same effects as those of semiconductor module 1A according to the first embodiment.

As described above, the semiconductor module 1A according to this embodiment includes: the sealing section 81u, 81v, 81w sealing the transistors 211 to 281; the intermediate terminals Mu, Mv, Mw each having the fastening surface 751 to which a cable to be connected to a load as a drive target is fastened in the direction intersecting the thickness direction of the sealing sections 81u, 81v, 81w, respectively, and connected to the transistors 211 to 281; and the structures 31u, 31v, 31w arranged between the sealing sections 81u, 81v, 81w, respectively, and the fastening surfaces 751 and having the input sections 411 to 471, 511 to 571 higher than the surfaces 811 of the sealing sections 81u, 81v, 81w, respectively, and the fastening surfaces 751. Further, the structures 31u, 31v, 31w have the output sections 421 to 581 higher than the surfaces 811 of the sealing sections 81u, 81v, 81w, respectively, and the fastening surfaces 751.

This enables the semiconductor module 1A to prevent the adhesion of an epoxy resin to terminals to which at least one of a large current and a high voltage is supplied.

Second Embodiment

Figure 8:
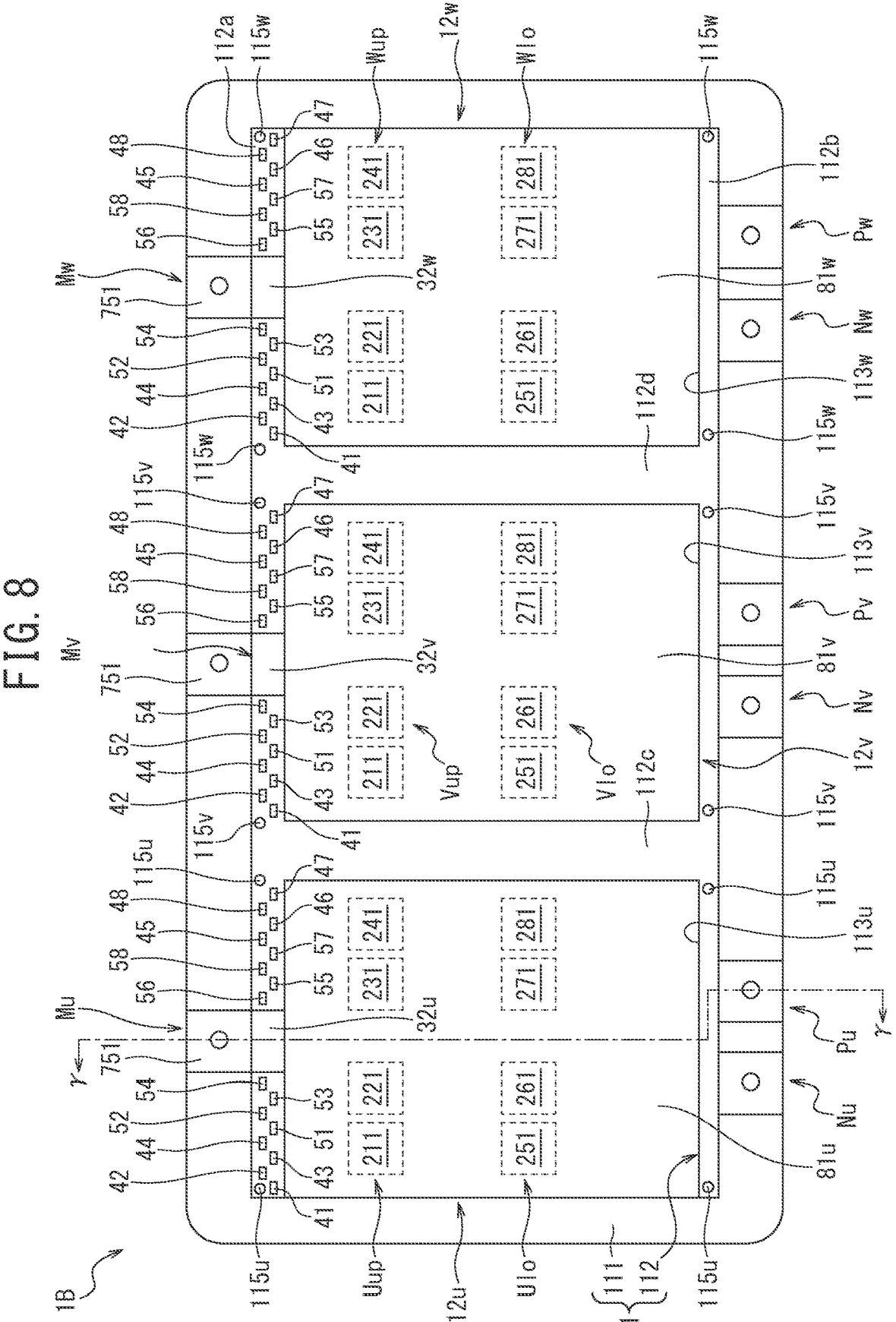
FIG. 8 is a schematic plan view illustrating a schematic configuration example of a semiconductor module according to a second embodiment of the present invention.
Figure 9:
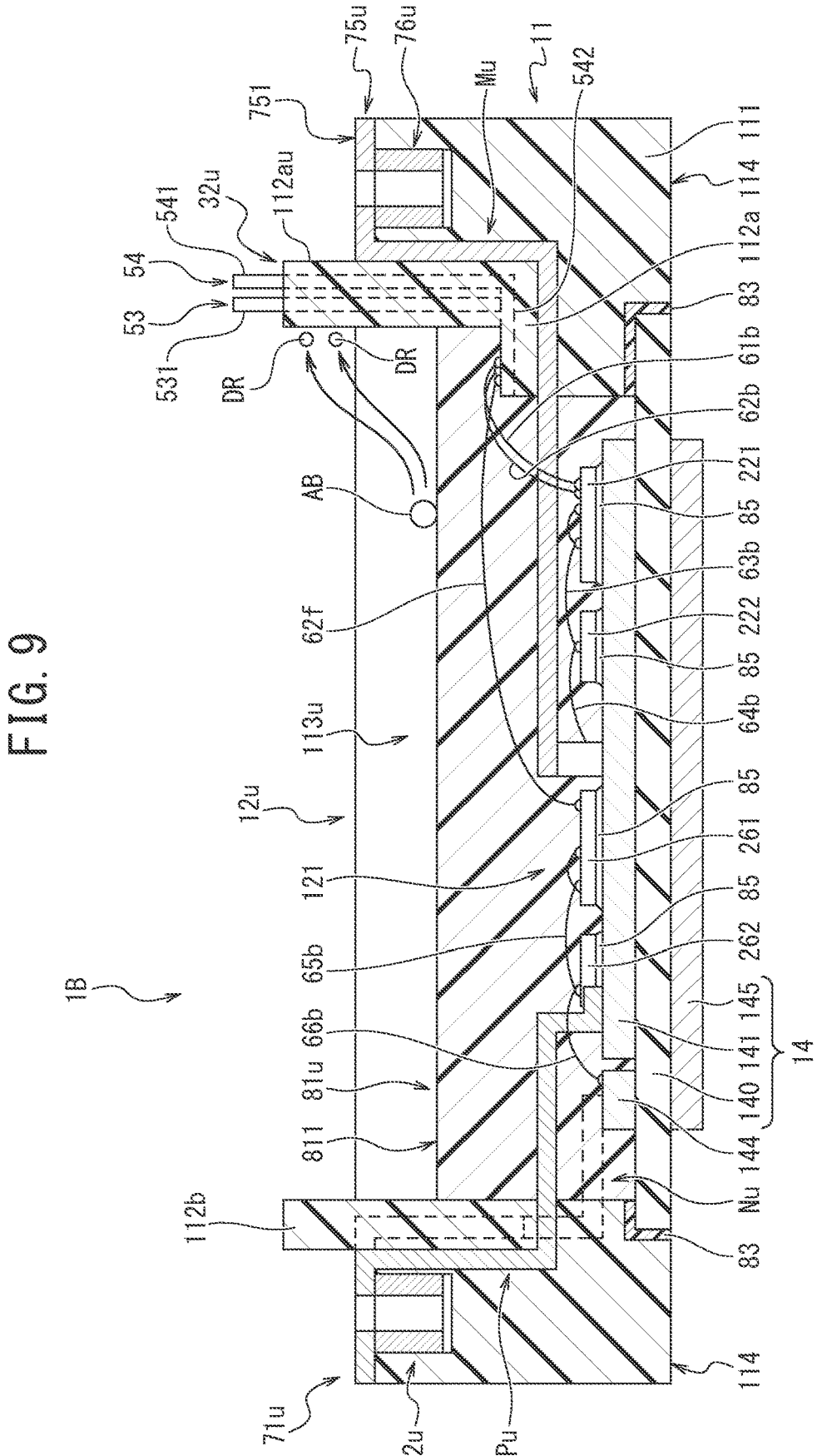
FIG. 9 is a schematic configuration example of a U-phase inverter section provided in the semiconductor module according to the second embodiment of the present invention and is a schematic cross-sectional view cut along the $\gamma$-$\gamma$ line illustrated in FIG. 8.

A semiconductor module according to a second embodiment of the present invention is described using FIGS. 8 and 9. Constituent components of the semiconductor module according to this embodiment having the same operations and functions as those of the semiconductor module 1A according to the first embodiment described above are attached by the same reference numerals and descriptions thereof are omitted.

As illustrated in FIG. 8, a semiconductor module 1B according to this embodiment includes sealing sections 81u, 81v, 81w sealing transistors 211 to 281 (an example of the plurality of switching elements). The semiconductor module 1B includes intermediate terminals Mu, Mv, Mw each having a fastening surface 751 to which a cable (not illustrated) connected to a load (not illustrated) as a drive target is fastened in a direction intersecting the thickness direction of the sealing sections 81u, 81v, 81w, respectively, and connected to transistors 211 to 281.

The semiconductor module 1B includes a structure 32u made of an epoxy resin, arranged between the sealing section 81u and the fastening surface 751 of the intermediate terminal Mu, and having at least a part higher than a surface 811 (see FIG. 9) of the sealing section 81u and the fastening surface 751. The semiconductor module 1B includes a structure 32v made of an epoxy resin, arranged between the sealing section 81v and the fastening surface 751 of the intermediate terminal Mv, and having at least a part higher than the surface of the sealing section 81v and the fastening surface 751. The semiconductor module 1B includes a structure 32w formed of an epoxy resin, arranged between the sealing section 81w and the fastening surface 751 of the intermediate terminal Mw, and having at least a part higher than the surface of the sealing section 81w and the fastening surface 751.

The structure 32u in this embodiment has a specific portion 112au forming a part of a case 11. The specific portion 112au is a portion arranged between the sealing section 81u and the fastening surface 751 of the intermediate terminal Mu of a region 112a of a partition section 112 constituting the case 11 in a plan view, for example. The specific portion 112au has the same height as that of a fixation section 115u, for example.

As illustrated in FIG. 9, the specific portion 112au has a height larger than that of the surface 811 of the sealing section 81u and the fastening surface 751 of the intermediate terminal Mu with a surface 114 of the case 11 as a reference. Therefore, the structure 32u having the specific portion 112au has a height larger than that of the surface 811 of the sealing section 81u and the fastening surface 751 of the intermediate terminal Mu.

The structure 32v has a specific portion 112av forming apart of the case 11. The specific portion 112av is a portion arranged between the sealing section 81v and the fastening surface 751 of the intermediate terminal Mv of the region 112a of the partition section 112 constituting the case 11 in a plan view, for example. The specific portion 112av has the same height as that of a fixation section 115v, for example.

Although not illustrated, the specific portion 112av has a height larger than that of the surface of the sealing section 81v and the fastening surface 751 of the intermediate terminal Mv with the surface 114 (see FIG. 9) of the case 11 as a reference. Therefore, the structure 32v having the specific portion 112av has a height larger than that of the surface of the sealing section 81v and the fastening surface 751 of the intermediate terminal Mv.

The structure 32w has a specific portion 112aw forming a part of the case 11. The specific portion 112aw is a portion arranged between the sealing section 81w and the fastening surface 751 of the intermediate terminal Mw of the region 112a of the partition section 112 constituting the case 11 in a plan view, for example. The specific portion 112aw has the same height as that of a fixation section 115w, for example.

Although not illustrated, the specific portion 112aw has a height larger than that of the surface of the sealing section 81w and the fastening surface 751 of the intermediate terminal Mw with the surface 114 (see FIG. 9) of the case 11 as a reference. Therefore, the structure 32w having the specific portion 112aw has a height larger than that of the surface of the sealing section 81w and the fastening surface 751 of the intermediate terminal Mw.

Thus, the semiconductor module 1B includes the structure 32u having the specific portion 112au having a height larger than that of the surface 811 of the sealing section 81u and the fastening surface 751 of the intermediate terminal Mu and arranged to shield the fastening surface 751 of the intermediate terminal Mu. Therefore, even when a bubble AB is generated in casting an epoxy resin, for example, in the casting region 113u to form the sealing section 81u, and the generated bubble AB is broken and droplets DR are scattered toward the intermediate terminal Mu, the droplets DR adhere to the specific portion 112au as illustrated in FIG. 9. This enables the structure 32u to prevent the adhesion of the droplets DR to the fastening surface 751 of the intermediate terminal Mu.

Although not illustrated, the structures 32v, 32w can also cause the droplets to adhere to the specific portions 112av, 112aw, respectively. This enables the structures 32v, 32w to prevent the adhesion of the droplets DR to the fastening surfaces 751 of the intermediate terminals Mv, Mw, respectively.

Therefore, the semiconductor module 1B obtains the same effects as those of the semiconductor module 1A according to the first embodiment above.

In this embodiment, the region 112a of the partition section 112 is formed such that portions corresponding to the specific portions 112au, 112av, 112aw are higher than that of the rest. However, the region 112a may be entirely formed at the same height as that of the specific portions 112au, 112av, 112aw.

As illustrated in FIG. 9, a region 112b of the partition section 112 provided in the semiconductor module 1B has a height larger than that of the surface 811 of the sealing section 81u and a fastening surface of each of a positive electrode terminal Pu and a negative electrode terminal Nu with the surface 114 of the case 11 as a reference. Therefore, even when the droplets DR caused by the bubble AB generated in casting an epoxy resin, for example, in the casting region 113u are scattered toward the positive electrode terminal Pu and the negative electrode terminal Nu, the droplets DR adhere to the region 112b. This enables the semiconductor module 1B to prevent the adhesion of the droplets DR to the fastening surface of each of the positive electrode terminal Pu and the negative electrode terminal Nu.

Although not illustrated, the region 112b of the partition section 112 provided in the semiconductor module 1B has a height larger than that of the surfaces of the sealing sections 81v, 81w and the fastening surface of each of the positive electrode terminals Pv and Pw and the negative electrode terminals Nv and Nw for each of a V-phase and a W-phase, respectively, with the surface 114 of the case 11 as a reference. Therefore, the droplets DR caused by the bubble AB generated in casting an epoxy resin, for example, even when the casting regions 113v, 113w are scattered toward the positive electrode terminals Pv and Pw and the negative electrode terminals Nv and Nw for each of the V-phase and the W-phase, respectively, the droplets DR adhere to the region 112b. This enables the semiconductor module 1B to prevent the adhesion of the droplets DR to the fastening surface of each of the positive electrode terminals Pv and Pw and the negative electrode terminals Nv and Nw for each of the V-phase and the W-phase, respectively.

Third Embodiment

Figure 10:
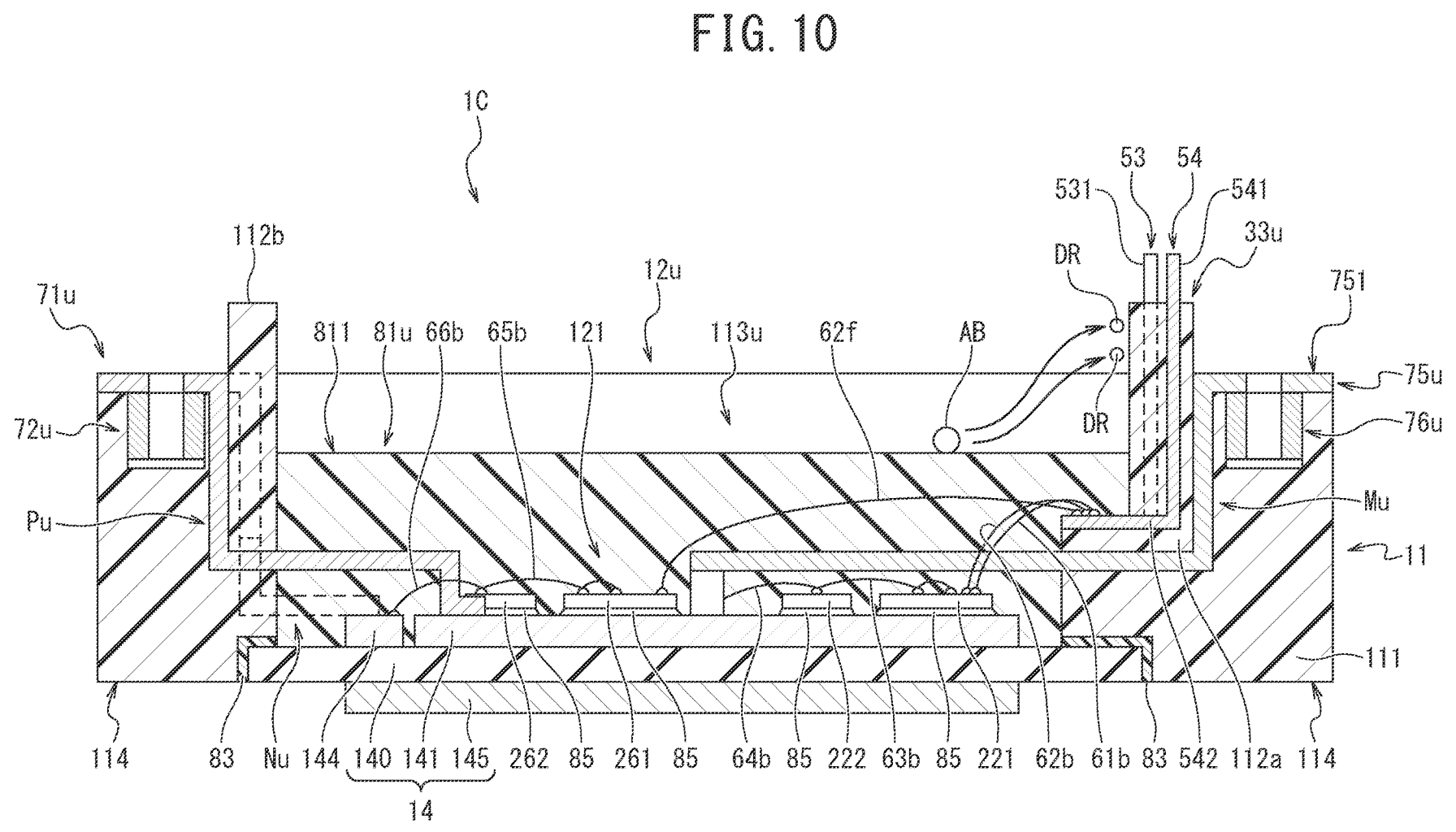

A semiconductor module according to a third embodiment of the present invention is described using FIG. 10. Constituent components of the semiconductor module according to this embodiment having the same operations and functions as those of the semiconductor module 1A according to the first embodiment described above are attached by the same reference numerals and descriptions thereof are omitted. A semiconductor module 1C according to this embodiment has the same configuration as that of the semiconductor module 1A according to the first embodiment above, except for a difference in the height of a region 112a of a partition section 112 constituting a case 11. Therefore, the planar configuration of the semiconductor module 1C is described with reference to FIG. 1 as necessary.

The semiconductor module 1C according to this embodiment includes sealing sections 81u, 81v, 81w (see FIG. 1) made of an epoxy resin and sealing transistors 211 to 281 (an example of the plurality of switching elements). Further, the semiconductor module 1C includes intermediate terminals Mu, Mv, Mw (see FIG. 1) each having a fastening surface 751 to which a cable (not illustrated) connected to a load (not illustrated) as a drive target is fastened in a direction intersecting the thickness direction of the sealing sections 81u, 81v, 81w, respectively, and connected to the transistors 211 to 281.

As illustrated in FIG. 10, the semiconductor module 1C includes a structure 33u arranged between the sealing section 81u and the fastening surface 751 of the intermediate terminal Mu and at least a part higher than a surface 811 of the sealing section 81u and the fastening surface 751. The semiconductor module 1C includes a structure (not illustrated) arranged between the sealing section 81v and the fastening surface 751 of the intermediate terminal Mv and having at least a part higher than the surface of the sealing section 81v (not illustrated) and the fastening surface 751. The structure is provided at a position corresponding to a structure 31v illustrated in FIG. 1. The semiconductor module 1C further includes a structure (not illustrated) arranged between the sealing section 81w and the fastening surface 751 of the intermediate terminal Mw and having at least a part higher than the surface of the sealing section 81w (not illustrated) and the fastening surface 751. The structure is provided at a position corresponding to a structure 31w illustrated in FIG. 1.

The structure 33u in this embodiment has some of the gate signal output terminals 41 to 57 and the current detection terminals 42 to 58, and a part of a region 112a of a partition section 112 constituting a case 11. The gate signal output terminals 41 to 57 and the current detection terminals 42 to 58 provided in the semiconductor module 1C have the same arrangement, for example, as that of the gate signal output terminals 41 to 57 and the current detection terminals 42 to 58 provided in the semiconductor module 1A. Therefore, the structure 33u has the gate signal output terminals 53, 55 and the current detection terminals 52, 54, 56, for example.

As illustrated in FIG. 10, the region 112a of the partition section 112 has a height larger than that of the surface 811 of the sealing section 81u and the fastening surface 751 of the intermediate terminal Mu with the surface 114 of the case 11 as a reference. Similarly, the gate signal output terminals 53, 55 and the current detection terminals 52, 54, 56 (FIG. 10 illustrate only the gate signal output terminal 53 and the current detection terminal 54.) have a height larger than that of the surface 811 of the sealing section 81u and the fastening surface 751 of the intermediate terminal Mu.

Thus, the semiconductor module 1C includes the structure 33u having a height larger than that of the surface 811 of the sealing section 81u and the fastening surface 751 of the intermediate terminal Mu and having the gate signal output terminals 53, 55, the current detection terminals 52, 54, 56, and the region 112a of the partition section 112 arranged to shield the fastening surface 751 of the intermediate terminal Mu. Therefore, a bubble AB is generated in casting an epoxy resin, for example, in a casting region 113u to form the sealing section 81u, and, even when the generated bubble AB is broken and droplets DR are scattered toward the intermediate terminal Mu, the droplets DR adhere to any of the gate signal output terminals 53, 55, the current detection terminals 52, 54, 56, and the region 112a as illustrated in FIG. 10. This enables the structure 33u to prevent the adhesion of the droplets DR to the fastening surface 751 of the intermediate terminal Mu.

Although not illustrated, a V-phase structure and a W-phase structure have the same configuration as that of the structure 33u, and therefore the droplets DR can be caused to adhere to any of the gate signal output terminals 53, 55, the current detection terminals 52, 54, 56, and the region 112a. Thus, the V-phase structure and the W-phase structure can prevent the adhesion of the droplets DR to the fastening surfaces 751 of the intermediate terminals Mv, Mw, respectively.

Therefore, the semiconductor module 1C obtains the same effects as those of the semiconductor module 1A according to the first embodiment described above.

As illustrated in FIG. 10, a region 112b of the partition section 112 provided in the semiconductor module 1C has a height larger than that of the surface 811 of the sealing section 81u and a fastening surface of each of a positive electrode terminal Pu and a negative electrode terminal Nu with the surface 114 of the case 11 as a reference. Although not illustrated, the region 112b of the partition section 112 has a height larger than that of the surfaces of the sealing sections 81v, 81w and the fastening surface of each of positive electrode terminals Pv, Pw, and negative electrode terminals Nv, Nw, respectively, with the surface 114 of the case 11 as a reference.

Therefore, even when the droplets caused by bubbles generated in casting an epoxy resin, for example, in the casting regions 113u and casting regions 113v, 113w are scattered toward the positive electrode terminals Pu, Pv, Pw and the negative electrode terminals Nu, Nv, Nw, respectively, the droplets adhere to the region 112b. This enables the semiconductor module 1C to prevent the adhesion of the droplets DR to the fastening surface of each of the positive electrode terminals Pu, Pv, Pw and the negative electrode terminals Nu, Nv, Nw, respectively.

The present invention can be variously modified without being limited to the embodiments described above.

In the first to third embodiments described above, the transistors provided in the semiconductor elements each contain a MOSFET but may contain an insulated gate bipolar transistor (IGBT).

The semiconductor modules according to the first to third embodiments described above each have the structure having at least one of the gate signal output terminal, the current detection terminal, and a part of the case, but the present invention is not limited thereto. The structure may have configurations other than the gate signal output terminal, the current detection terminal, and the case insofar as the structure is arranged between the sealing section and the intermediate terminal.

In the first to third embodiments described above, the gate signal output terminals and the current detection terminals are arranged in two rows, but may be arranged in one row or three or more rows.

In the first embodiment described above, the region 112*b* of the partition section 112 constituting the case 11 has substantially the same height as that of the fastening surface of each of the positive electrode terminals Pu, Pv, Pw and the negative electrode terminals Nu, Nv, Nw, respectively, but the present invention is not limited thereto. The region 112*b* in the first embodiment described above may have a height larger than that of the fastening surface of each of the positive electrode terminals Pu, Pv, Pw and the negative electrode terminals Nu, Nv, Nw, respectively. This enables the semiconductor module 1A according to the first embodiment described above to prevent the adhesion of the droplets DR to the fastening surface of each of the positive electrode terminals Pu, Pv, Pw and the negative electrode terminals Nu, Nv, Nw, respectively.

The technical scope of the present invention is not limited to the illustrated and described exemplary embodiments, and also includes all embodiments that provide effects equivalent to the effects intended by the present invention. Further, the technical scope of the present invention is not limited to combinations of the features of the invention defined by claims, and can be defined by any desired combination of specific features among all the disclosed features.

REFERENCE SIGNS LIST 1A, 1B, 1C, 9 semiconductor module
11 case
12*u* U-phase inverter section
12*v* V-phase inverter section
12*w* W-phase inverter section
14 DBC substrate
21 to 28 semiconductor element
31*u*, 31*v*, 31*w*, 32*u*, 32*v*, 32*w*, 33*u* structure
41, 43, 45, 47, 51, 53, 55, 57 gate signal output terminal
42, 44, 46, 48, 52, 54, 56, 58 current detection terminal
61*a* to 61*h*, 62*a* to 62*h*, 63*a* to 63*d*, 64*a* to 64*d*, 65*a* to 65*d*, 66*a* to 66*d* bonding wire
71*u*, 73*u*, 75*u* fastening section
72*u*, 76*u*, 115*u*, 115*v*, 115*w* fixation section
81*u*, 81*v*, 81*w*, 92 sealing section
83 adhesive
85 solder
91, Mu, My, Mw intermediate terminal
93 control terminal group
111 peripheral portion
112 partition section
112*a*, 112*b*, 112*c*, 112*d* region
112*au*, 112*av*, 112*aw* specific portion
113*u*, 113*v*, 113*w* casting region
114, 811, SF surface
121 inverter circuit
140 insulating substrate
141 positive electrode side wiring pattern
141*a* first portion
141*b* second portion
142, 143 intermediate wiring pattern
142*b* second portion
144 negative electrode side wiring pattern
145 heat transfer pattern
211, 221, 231, 241, 251, 261, 271, 281 transistor
212, 222, 232, 242, 252, 262, 272, 282 freewheel diode

30

411, 422, 431, 442, 451, 462, 471, 482, 511, 522, 531, 542, 551, 562, 571, 582 input section
412, 421, 432, 441, 452, 461, 472, 481, 512, 521, 532, 541, 552, 561, 572, 581 output section
751, 911 fastening surface
A anode
AB bubble
DI distance
DR droplet
Nu, Nv, Nw negative electrode terminal
Pu, Pv, Pw positive electrode terminal
TH through hole
Ulo, Vlo, Wlo lower arm
Uup, Vup, Wup upper arm
The invention claimed is:

1. A semiconductor module comprising:
a sealing section containing epoxy resin and sealing a plurality of switching elements;
an intermediate terminal having a fastening surface at a position higher than a surface of the sealing section, to which a cable connected to a load as a drive target is fastened, and which is connected to the plurality of switching elements;
a case defining a casting region where the sealing section is cast; and
a structure disposed between the sealing section and the fastening surface and having at least a part higher than a surface of the sealing section and the fastening surface,
wherein the structure has
a part of the case which, when viewed in a side view in a direction in which the sealing section and the intermediate terminal are arranged, extends above the fastening surface and includes a portion overlapping the fastening surface, and
a plurality of control terminals which are provided on an upper surface of the part of the case, between the sealing section and the fastening surface, and each control terminal of the plurality of control terminals has a surface having a predetermined spread in the part of the structure such that an entire width of the intermediate terminal is shielded when viewed in the direction in which the sealing section and the intermediate terminal are arranged, the plurality of control terminals being arranged in rows in a plan view, and
the structure is disposed between the sealing section and the fastening surface in the plan view so as to shield the fastening surface.

2. The semiconductor module according to claim 1, wherein the plurality of control terminals is arranged in a plurality of rows along a direction intersecting a direction in which the sealing section and the intermediate terminal are arranged.

3. The semiconductor module according to claim 2, wherein some of the plurality of control terminals adjacent to each other when viewed in the direction in which the sealing section and the intermediate terminal are arranged are arranged not to overlap each other.

4. The semiconductor module according to claim 2, wherein some of the plurality of control terminals each has a through hole penetrating the part in the direction in which the sealing section and the intermediate terminal are arranged.

5. The semiconductor module according to claim 2, wherein a control terminal of the plurality of control terminals is configured such that a current smaller than a current flowing to the intermediate terminal flows, and such that a voltage lower than a voltage applied to the intermediate terminal is applied.

6. The semiconductor module according to claim 3, wherein some of the plurality of control terminals each has a through hole penetrating the part in the direction in which the sealing section and the intermediate terminal are arranged.

7. The semiconductor module according to claim 3, wherein a control terminal of the plurality of control terminals is configured such that a current smaller than a current flowing to the intermediate terminal flows, and such that a voltage lower than a voltage applied to the intermediate terminal is applied.

8. The semiconductor module according to claim 4, wherein a control terminal of the plurality of control terminals is configured such that a current smaller than a current flowing to the intermediate terminal flows, and such that a voltage lower than a voltage applied to the intermediate terminal is applied.

* * * * *